US012727419B2

(12) United States Patent
Sekiya

(10) Patent No.: US 12,727,419 B2
(45) Date of Patent: Sep. 1, 2026

(54) WAFER PROCESSING METHOD

(71) Applicant: DISCO CORPORATION, Tokyo (JP)

(72) Inventor: Kazuma Sekiya, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 481 days.

(21) Appl. No.: 18/490,158

(22) Filed: Oct. 19, 2023

(65) Prior Publication Data

US 2024/0145308 A1 May 2, 2024

(30) Foreign Application Priority Data

Oct. 27, 2022 (JP) ................................ 2022-172136
Oct. 27, 2022 (JP) ................................ 2022-172137
Oct. 27, 2022 (JP) ................................ 2022-172138

(51) Int. Cl.
*H10P 54/00* (2026.01)
*H10P 52/00* (2026.01)

(52) U.S. Cl.
CPC .............. *H10P 54/00* (2026.01); *H10P 52/00* (2026.01)

(58) Field of Classification Search
CPC .......... H10P 54/00; H10P 54/30; H10P 52/00; H10P 52/40; H10P 58/00; H10P 58/20
See application file for complete search history.

(56) References Cited

U.S. PATENT DOCUMENTS

2020/0058483 A1* 2/2020 Hirata .................... H10P 90/12
2021/0296119 A1 9/2021 Tanoue et al.
2021/0358736 A1 11/2021 Priewasser

FOREIGN PATENT DOCUMENTS

JP 2007158239 A 6/2007
JP 2020057709 A 4/2020
JP 2020136442 A 8/2020
JP 2021182622 A 11/2021
JP 7129558 B2 9/2022
WO 2020017599 A1 1/2020
WO 2020213479 10/2020
WO 2021172085 A1 9/2021

OTHER PUBLICATIONS

Office Action issued in counterpart Japanese patent application No. 2022-172136, dated May 7, 2026.
Office Action issued in counterpart Japanese patent application No. 2022-172137, dated May 7, 2026.
Action issued in counterpart Japanese patent application No. 2022-172138, dated May 26, 2026.

* cited by examiner

*Primary Examiner* — Reema Patel
(74) *Attorney, Agent, or Firm* — GREER BURNS & CRAIN, LTD.

(57) ABSTRACT

A wafer processing method for dividing a wafer at a peeling layer after forming the peeling layer within the wafer includes a peeling layer forming step of forming a first peeling layer along the side surface of a circular truncated cone and a second peeling layer along the upper surface of the circular truncated cone, a dividing step of dividing the wafer so as to form a thinned wafer that has a first peeling surface exposed by being divided at the first peeling layer and has a second peeling surface exposed by being divided at the second peeling layer, a grinding step of subjecting the second peeling surface to grinding, and a polishing step of subjecting the first peeling surface and the second peeling surface to polishing.

17 Claims, 15 Drawing Sheets

WAFER PROCESSING METHOD

BACKGROUND OF THE INVENTION

Field of the Invention

The present invention relates to a wafer processing method for dividing a wafer at a peeling layer, the wafer having a plurality of devices formed on a top surface side thereof and including a chamfered outer circumferential region, by applying an external force to the wafer along a thickness direction of the wafer after forming the peeling layer within the wafer by irradiating the wafer with a laser beam having a wavelength that passes through the wafer.

Description of the Related Art

Chips of devices such as integrated circuits (ICs) or memories are generally manufactured by using a disk-shaped wafer formed of a semiconductor material such as silicon (Si). Specifically, this wafer is demarcated by planned dividing lines set in a lattice manner, and a device is formed on the top surface side of each of a plurality of regions.

Then, the chips are manufactured by dividing the wafer along the planned dividing lines. Further, the wafer may be provided with silicon through electrodes (TSVs) for a purpose of high integration of a package including a plurality of chips or the like. In this package, for example, electrodes included in the different chips can be electrically connected to each other via the TSVs.

The TSVs are, for example, provided in the wafer in the following order. First, grooves are formed in the top surface side of the wafer. Next, the TSVs are provided in the grooves. Next, the top surface side of the wafer is laminated to a support wafer. Next, an undersurface of the wafer is subjected to grinding until the TSVs are exposed on the undersurface of the wafer.

Here, the outer circumferential region of the wafer is often chamfered for a purpose of preventing cracks or the like. Then, when the undersurface of the wafer whose outer circumferential region is chamfered is ground until the thickness of the wafer becomes half or less, the undersurface side of the outer circumferential region has a shape as of a knife edge.

In this case, during the grinding of the wafer, stress concentrates on the undersurface side of the outer circumferential region, and thus the wafer tends to be cracked, so that a yield of chips obtained from the wafer may be decreased. Accordingly, for example, removing a part of the top surface side of the outer circumferential region (generally-called edge trimming) before the grinding of the undersurface of the wafer has been proposed (see Japanese Patent Laid-Open No. 2007-158239 and Japanese Patent Laid-Open No. 2020-57709, for example).

In addition, in the case where the undersurface of the wafer is subjected to grinding until the TSVs are exposed on the undersurface of the wafer, an amount of grinding of the wafer is increased, and an amount of wear of grindstones necessary for grinding the wafer is increased. In this case, a cost of chips or packages manufactured by using the wafer may be increased, and processing thereof may be prolonged.

In view of these points, a method of dividing the wafer by using a laser beam having a wavelength that passes through the wafer has been proposed (see Japanese Patent Laid-Open No. 2020-136442, for example). In this method, first, a region of the wafer in which region no diffused reflection occurs at a time of application of the laser beam (in short, a region inward of the chamfered outer circumferential region) is annularly irradiated with the laser beam in a state in which a condensing point is positioned on the top surface side of the wafer.

Consequently, a peeling layer (peeling layer in a cylindrical shape) is formed along the side surface of a circular cylinder whose lower surface is located on the top surface side of the wafer and whose upper surface is located within the wafer. Next, a region inward of the peeling layer in a cylindrical shape is irradiated with the laser beam in a state in which the condensing point is positioned at the upper surface of the circular cylinder described above. Consequently, a peeling layer (peeling layer in a disk shape) is formed along the upper surface of the circular cylinder described above.

Next, the wafer is divided at the peeling layer in a cylindrical shape and the peeling layer in a disk shape by applying external forces to the wafer. Consequently, a thinned wafer is formed which has a side surface exposed by being divided at the peeling layer in a cylindrical shape and has an upper surface exposed by being divided at the peeling layer in a disk shape.

SUMMARY OF THE INVENTION

In the case where the wafer is divided at the peeling layer in a cylindrical shape and the peeling layer in a disk shape as described above, it is necessary to separate the outer circumferential region of the wafer from a device region along a radial direction of the wafer, and separate the undersurface side of the device region from the top surface side along a thickness direction of the wafer.

Here, the direction of an external force necessary to separate the outer circumferential region of the wafer from the device region and the direction of an external force necessary to separate the undersurface side of the device region from the top surface side are orthogonal to each other. It is therefore not necessarily easy to divide the wafer simultaneously at the peeling layer in a cylindrical shape and the peeling layer in a disk shape by applying an external force along a specific direction to the wafer.

For example, in a case where the wafer is divided by applying an external force along the thickness direction of the wafer to the wafer, the side surface of the thinned wafer formed by dividing the wafer and the inner surface of a remaining part (part including the outer circumferential region) of the wafer may come into contact with each other. Then, in this case, a crack caused by the contact between both may be formed.

In addition, as described above, the peeling layer in a cylindrical shape is formed in the region of the wafer in which region no diffused reflection occurs at a time of application of the laser beam (in short, the region inward of the chamfered outer circumferential region). Therefore, in the case where the wafer is divided at the peeling layer in a cylindrical shape, a crack may extend to a device formed on the top surface side of the thinned wafer, and the device may be consequently damaged.

Incidentally, such device damage can be prevented unless devices are formed in a region in the vicinity of the side surface of the thinned wafer. In this case, however, the number of chips that can be manufactured from the wafer may be decreased.

In view of the above points, it is an object of the present invention to provide a wafer processing method that can suppress damage to devices which damage may accompany the formation of the thinned wafer and suppress a decrease in the number of chips that can be manufactured from the wafer.

In accordance with an aspect of the present invention, there is provided a wafer processing method for dividing a wafer at a peeling layer, the wafer having a plurality of devices formed on a top surface side of the wafer and including a chamfered outer circumferential region, by applying an external force to the wafer along a thickness direction of the wafer after forming the peeling layer within the wafer by irradiating the wafer with a laser beam having a wavelength that passes through the wafer. The wafer processing method includes a peeling layer forming step of forming a first peeling layer along a side surface of a circular truncated cone and a second peeling layer along a second base of the circular truncated cone, the circular truncated cone being defined by a first base located on the top surface side of the wafer, the side surface that has one end coinciding with an outer circumference of the first base and is inclined so as to become more distant from the outer circumferential region with increasing distance from the top surface side of the wafer, and the second base that has an outer circumference coinciding with another end of the side surface and is parallel with the first base, a dividing step of dividing the wafer so as to form a thinned wafer that has a first peeling surface exposed by being divided at the first peeling layer and has a second peeling surface exposed by being divided at the second peeling layer after performing the peeling layer forming step, a grinding step of subjecting the second peeling surface to grinding after performing the dividing step, and a polishing step of subjecting the first peeling surface and the second peeling surface to polishing after performing the grinding step.

In accordance with another aspect of the present invention, there is provided a wafer processing method for dividing a wafer at a peeling layer, the wafer having a plurality of devices formed on a top surface side of the wafer and including a chamfered outer circumferential region, by applying an external force to the wafer along a thickness direction of the wafer after forming the peeling layer within the wafer by irradiating the wafer with a laser beam having a wavelength that passes through the wafer. The wafer processing method includes a peeling layer forming step of forming a first peeling layer along a side surface of a circular truncated cone and a second peeling layer along a second base of the circular truncated cone, the circular truncated cone being defined by a first base located on the top surface side of the wafer, the side surface that has one end coinciding with an outer circumference of the first base and is inclined so as to become more distant from the outer circumferential region with increasing distance from the top surface side of the wafer, and the second base that has an outer circumference coinciding with another end of the side surface and is parallel with the first base, a dividing step of dividing the wafer so as to form a thinned wafer that has a first peeling surface exposed by being divided at the first peeling layer and has a second peeling surface exposed by being divided at the second peeling layer after performing the peeling layer forming step, a wet etching step of subjecting at least the first peeling surface to wet etching after performing the dividing step, a grinding step of subjecting the second peeling surface to grinding after performing the wet etching step, and a polishing step of subjecting the first peeling surface and the second peeling surface to polishing after performing the grinding step.

In accordance with a further aspect of the present invention, there is provided a wafer processing method for dividing a wafer at a peeling layer, the wafer having a plurality of devices formed on a top surface side of the wafer and including a chamfered outer circumferential region, by applying an external force to the wafer along a thickness direction of the wafer after forming the peeling layer within the wafer by irradiating the wafer with a laser beam having a wavelength that passes through the wafer. The wafer processing method includes a peeling layer forming step of forming a first peeling layer along a side surface of a circular truncated cone and a second peeling layer along a second base of the circular truncated cone, the circular truncated cone being defined by a first base located on the top surface side of the wafer, the side surface that has one end coinciding with an outer circumference of the first base and is inclined so as to become more distant from the outer circumferential region with increasing distance from the top surface side of the wafer, and the second base that has an outer circumference coinciding with another end of the side surface and is parallel with the first base, a dividing step of dividing the wafer so as to form a thinned wafer that has a first peeling surface exposed by being divided at the first peeling layer and has a second peeling surface exposed by being divided at the second peeling layer after performing the peeling layer forming step, a dry etching step of subjecting at least the first peeling surface to dry etching after performing the dividing step, a grinding step of subjecting the second peeling surface to grinding after performing the dry etching step, and a polishing step of subjecting the first peeling surface and the second peeling surface to polishing after performing the grinding step. Incidentally, preferably, in the dry etching step, the second peeling surface is subjected to the dry etching together with the first peeling surface. Alternatively, preferably, in the dry etching step, the first peeling surface is subjected to the dry etching in a state in which the second peeling surface is provided with a mask.

Preferably, the wafer processing method according to the present invention further includes a laminating step of laminating the top surface side of the wafer to a top surface side of a second wafer different from the wafer before performing the dividing step.

Further, preferably, in the peeling layer forming step, one of the first peeling layer and the second peeling layer is formed, and then the other is formed. Alternatively, preferably, the wafer includes a first region and a second region each extending along a predetermined direction, the first peeling layer includes a pair of first inclined portions formed in the first region and a pair of second inclined portions formed in the second region, the second peeling layer includes a first linear portion formed in the first region and located between the pair of first inclined portions in the predetermined direction and a second linear portion formed in the second region and located between the pair of second inclined portions in the predetermined direction, and in the peeling layer forming step, the pair of first inclined portions and the first linear portion are formed, and then the pair of second inclined portions and the second linear portion are formed.

In addition, preferably, an angle formed between the first base and the side surface of the circular truncated cone is equal to or more than 1° and equal to or less than 80°.

In the present invention, the first peeling layer along the side surface of the circular truncated cone and the second peeling layer along the second base of the circular truncated cone are formed within the wafer, the circular truncated cone being defined by the first base located on the top surface side of the wafer, the side surface that has one end coinciding with the outer circumference of the first base and is inclined so as to become more distant from the outer circumferential region with increasing distance from the top surface side of the wafer, and the second base that has an outer circumference coinciding with another end of the side surface and is parallel with the first base.

Then, in the present invention, the wafer is divided so as to form the thinned wafer that has the first peeling surface (side surface) exposed by being divided at the first peeling layer and the second peeling surface (upper surface) exposed by being divided at the second peeling layer.

Here, in the wafer, the first peeling layer is formed so as to be along the side surface of the circular truncated cone. In this case, there is a low probability that the side surface of the thinned wafer and the inner surface of a remaining part (part including the outer circumferential region) of the wafer come into contact with each other when the wafer is divided. The present invention can therefore suppress the occurrence of a crack due to the contact between both.

Further, in the wafer, cracks tend to extend in a direction along the side surface of the circular truncated cone from the first peeling layer. In this case, there is a low probability that cracks extend toward the devices formed on the top surface side of the thinned wafer. The present invention can therefore suppress damage to the devices which damage may accompany the formation of the thinned wafer and suppress a decrease in the number of chips that can be manufactured from the wafer.

The above and other objects, features and advantages of the present invention and the manner of realizing them will become more apparent, and the invention itself will best be understood from a study of the following description and appended claims with reference to the attached drawings showing a preferred embodiment of the invention.

DETAILED DESCRIPTION OF THE PREFERRED EMBODIMENT

Figure 1A:
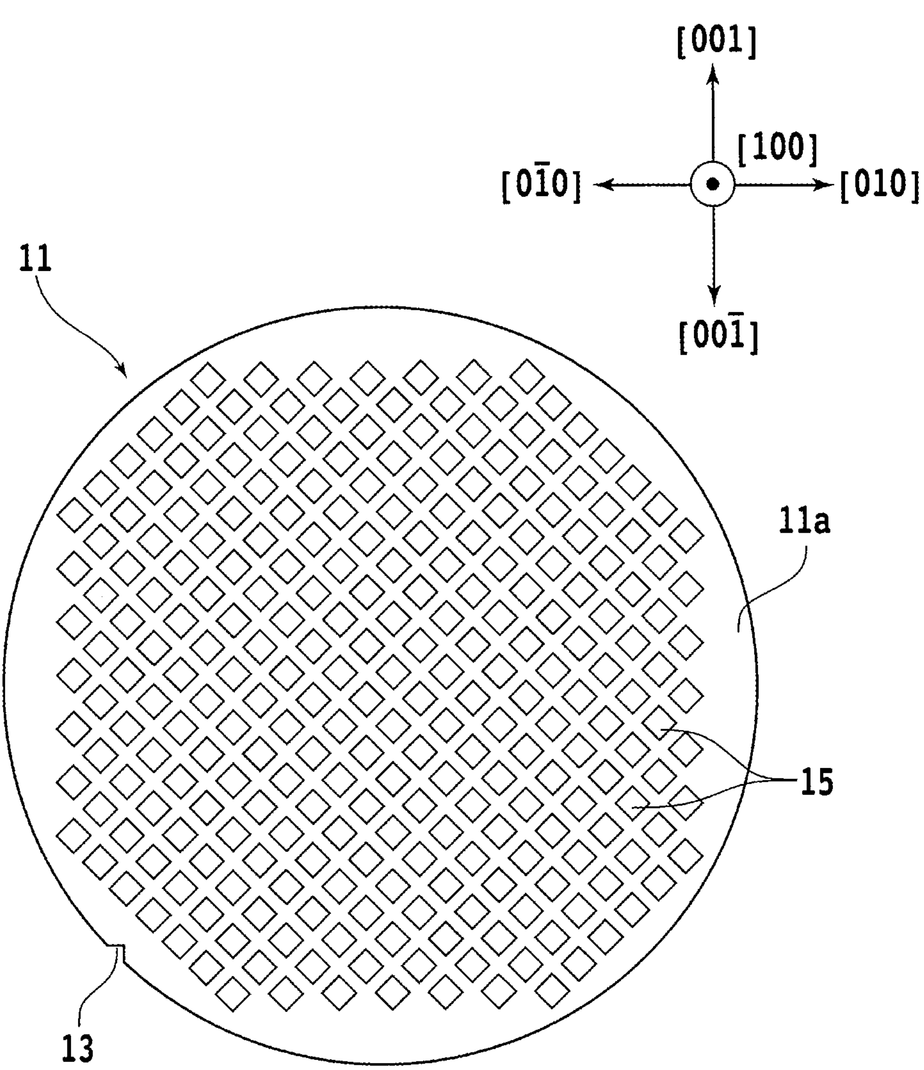
FIG. 1A is a top view schematically depicting an example of a wafer.
Figure 1B:
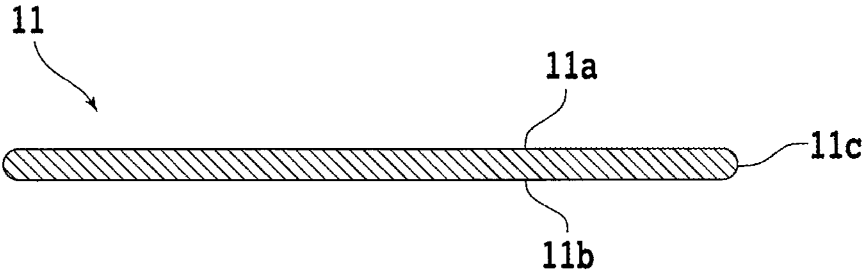
FIG. 1B is a sectional view schematically depicting the example of the wafer.

An embodiment of the present invention will be described with reference to the accompanying drawings. FIG. 1A is a top view schematically depicting an example of a wafer. FIG. 1B is a sectional view schematically depicting the example of the wafer. Incidentally, FIG. 1A also depicts crystal directions of a single crystal material (single crystal silicon in this case) constituting the wafer.

The wafer 11 depicted in FIG. 1A and FIG. 1B is formed of single crystal silicon in a cylindrical shape such that a specific crystal plane (suppose here for convenience that the specific crystal plane is a crystal plane (100)) included in crystal planes {100} is exposed on each of a top surface 11*a* and an undersurface 11*b*. That is, the wafer 11 is formed of single crystal silicon in a cylindrical shape such that a perpendicular (crystal axis) to each of the top surface 11*a* and the undersurface 11*b* is along a crystal direction [100].

Incidentally, although the wafer 11 is manufactured such that the crystal plane (100) is exposed on each of the top surface 11*a* and the undersurface 11*b*, each of the top surface 11*a* and the undersurface 11*b* may be a surface slightly tilted from the crystal plane (100) due to a processing error or the like at a time of manufacturing. Specifically, each of the top surface 11*a* and the undersurface 11*b* of the wafer 11 may be a surface such that an acute angle formed between each of the top surface 11*a* and the undersurface 11*b* and the crystal plane (100) is equal to or less than 1°.

That is, a crystal axis of the wafer 11 may be along a direction such that an acute angle formed between the crystal axis of the wafer 11 and the crystal direction [100] is equal to or less than 1°. In addition, a notch 13 is formed in a side surface 11*c* of the wafer 11. A center of the wafer 11 is located in a specific crystal direction (suppose here for convenience that the specific crystal direction is a crystal direction [011]) included in crystal directions <110> as viewed from the notch 13.

Further, the wafer 11 is demarcated into a plurality of regions by a plurality of planned dividing lines intersecting each other. A device 15 such as an IC or a memory is formed on the top surface 11*a* side in each of the regions. Further, grooves provided with TSVs may be formed on the top surface 11*a* side of the wafer 11.

In addition, an outer circumferential region of the wafer 11 is chamfered. That is, the side surface 11*c* of the wafer 11 is curved so as to be projection outward. Incidentally, no device 15 is formed in the outer circumferential region of the wafer 11. That is, a region in which the devices 15 are formed (device region) in the wafer 11 is surrounded by the outer circumferential region.

It is to be noted that there is no limitation on the material, shape, structure, size, or the like of the wafer 11. The wafer

11 may, for example, be formed of a semiconductor material other than silicon (the semiconductor material is, for example, silicon carbide (SiC), gallium nitride (GaN), or the like). Similarly, there is no limitation on the kind, quantity, shape, structure, size, arrangement, or the like of the devices 15 either.

Figure 2:
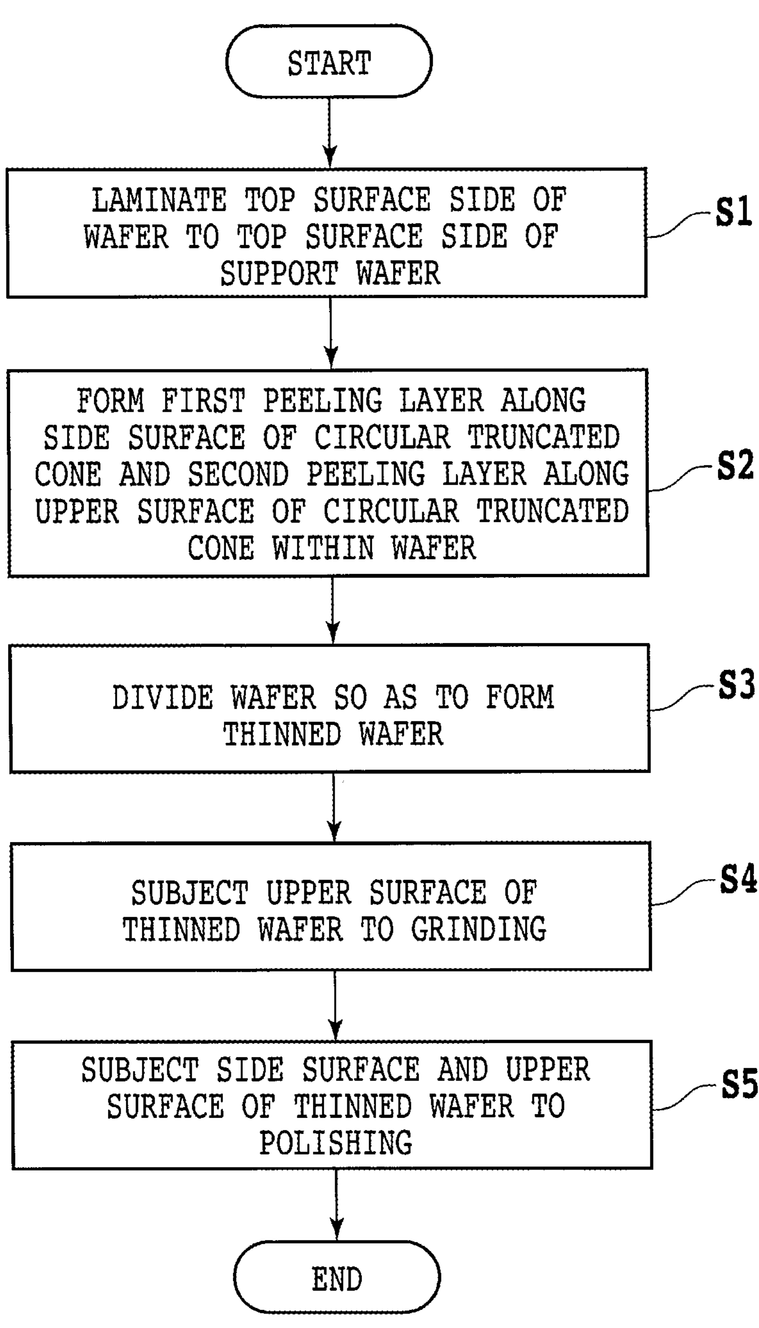
FIG. 2 is a flowchart schematically depicting an example of a wafer processing method.
Figure 3:
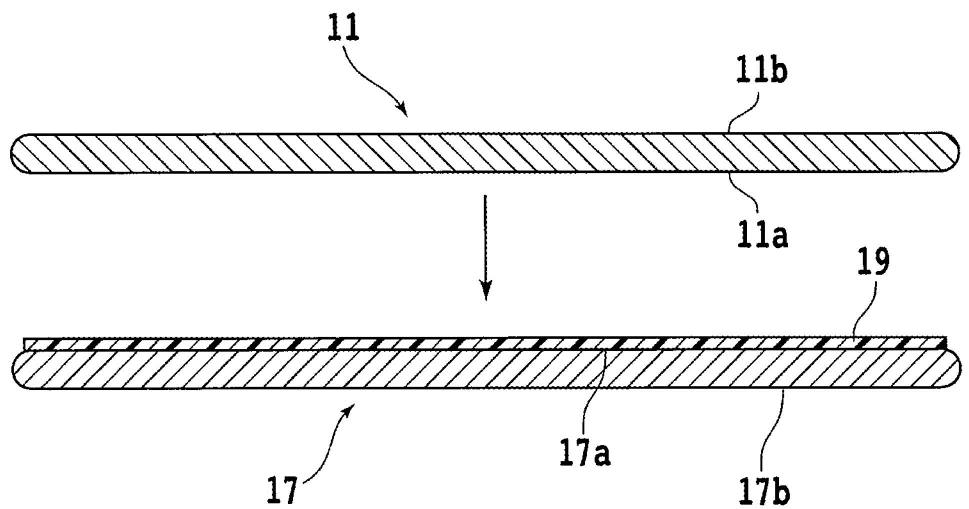
FIG. 3 is a sectional view schematically depicting a manner in which a top surface side of the wafer is laminated to the top surface side of a support wafer.

FIG. 2 is a flowchart schematically depicting an example of a wafer processing method. In this method, first, the top surface 11*a* side of the wafer 11 is laminated to the top surface side of a support wafer (second wafer) (laminating step S1). FIG. 3 is a sectional view schematically depicting a manner in which the top surface 11*a* side of the wafer 11 is laminated to the top surface side of the support wafer.

Incidentally, the support wafer 17 that is laminated to the wafer 11, for example, has a shape similar to that of the wafer 11. In addition, as in the wafer 11, a plurality of devices may be formed on a top surface 17*a* side of the support wafer 17. In addition, the top surface 17*a* of the support wafer 17 is, for example, provided with an adhesive 19 such as an acrylic-based adhesive or an epoxy-based adhesive.

Then, in the laminating step S1, the top surface 11*a* of the wafer 11 is pressed against the top surface 17*a* of the support wafer 17 with the adhesive 19 interposed therebetween in a state in which an undersurface 17*b* side of the support wafer 17 is supported. A laminated wafer is thereby formed in which the top surface 11*a* side of the wafer 11 is laminated to the top surface 17*a* side of the support wafer 17.

After the laminating step S1 is performed, a peeling layer is formed within the wafer 11 by applying a laser beam having a wavelength that passes through the wafer 11 from above to the wafer 11 disposed such that the undersurface 11*b* is oriented upward. Specifically, a first peeling layer along a side surface of a circular truncated cone and a second peeling layer along an upper surface of the circular truncated cone are formed within the wafer 11 (peeling layer forming step S2).

Incidentally, this circular truncated cone is an imaginary structure including a lower surface (first base) located on the top surface 11*a* side of the wafer 11, a side surface that has a lower end (one end) coinciding with an outer circumference of the lower surface and is inclined so as to become more distant from the outer circumferential region with increasing distance from the top surface 11*a* side of the wafer 11, and an upper surface (second base) that has an outer circumference coinciding with an upper end (another end) of the side surface and is parallel with the lower surface. In addition, an angle formed between the first base and the side surface of the circular truncated cone is, for example, equal to or more than 1° and equal to or less than 80°.

Figure 4:
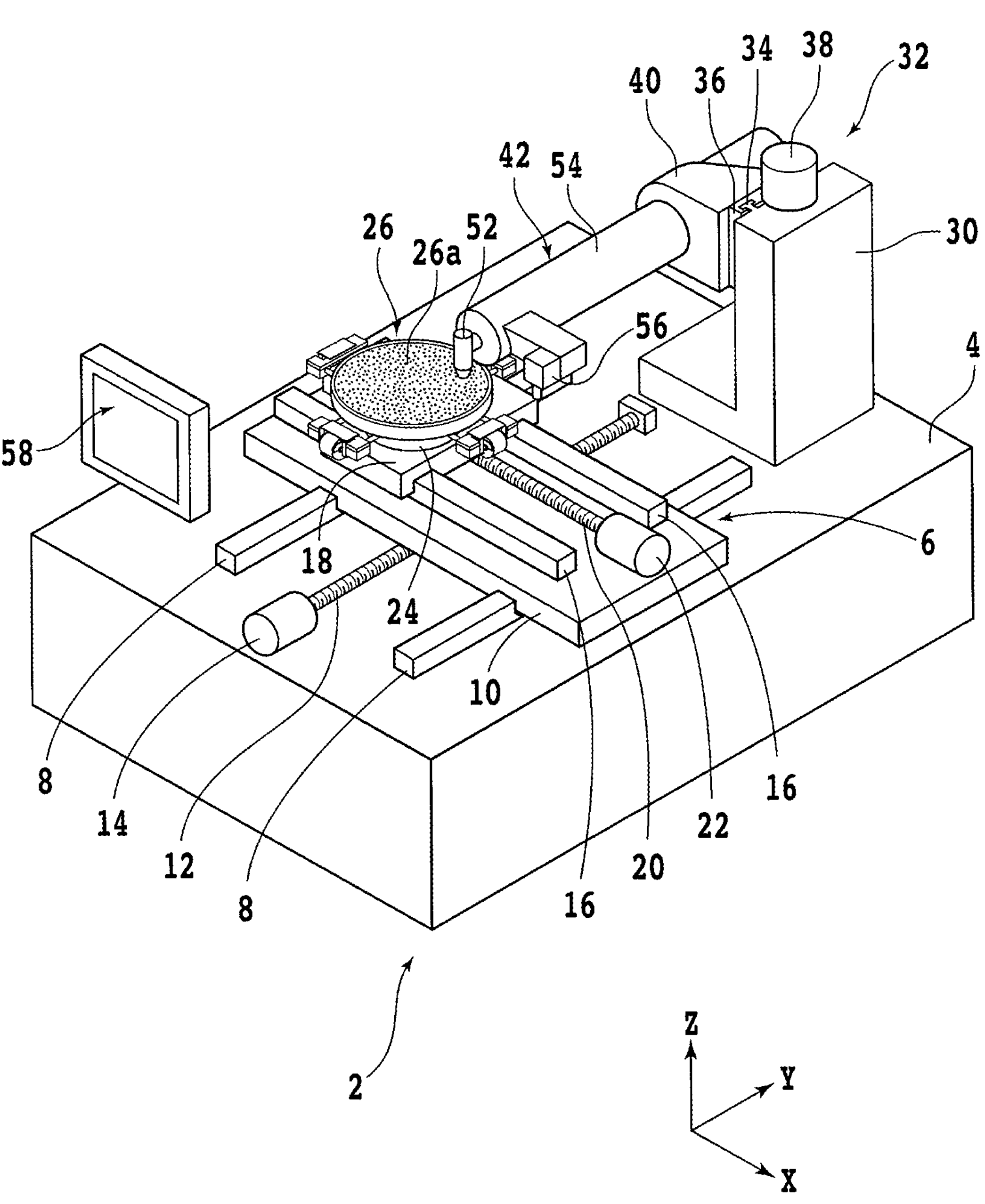
FIG. 4 is a perspective view schematically depicting an example of a laser processing apparatus.

FIG. 4 is a perspective view schematically depicting an example of a laser processing apparatus used in the peeling layer forming step S2. Incidentally, an X-axis direction (left-right direction) and a Y-axis direction (front-rear direction) depicted in FIG. 4 are directions orthogonal to each other on a horizontal plane, and a Z-axis direction (upward-downward direction) is a direction (vertical direction) orthogonal to each of the X-axis direction and the Y-axis direction.

The laser processing apparatus 2 depicted in FIG. 4 has a base 4 that supports various constituent elements. A horizontal moving mechanism 6 is disposed on the upper surface of the base 4. Moreover, the horizontal moving mechanism 6 includes a pair of Y-axis guide rails 8 that are fixed to the upper surface of the base 4 and extend along the Y-axis direction.

A Y-axis moving plate 10 is coupled to the upper surface sides of the pair of Y-axis guide rails 8 in such a manner as to be slidable along the pair of Y-axis guide rails 8. In addition, a threaded shaft 12 extending along the Y-axis direction is disposed between the pair of Y-axis guide rails 8. A motor 14 for rotating the threaded shaft 12 is coupled to a front end portion (one end portion) of the threaded shaft 12.

In addition, on the surface of the threaded shaft 12 in which surface spiral grooves are formed, a nut (not depicted) is provided which houses a large number of balls that roll on the surface of the threaded shaft 12 being rotated. A ball screw is thus formed. That is, when the threaded shaft 12 is rotated, the large number of balls circulate within the nut, and the nut moves along the Y-axis direction.

Further, this nut is fixed to the lower surface side of the Y-axis moving plate 10. Therefore, when the threaded shaft 12 is rotated by the motor 14, the Y-axis moving plate 10 moves along the Y-axis direction together with the nut. In addition, a pair of X-axis guide rails 16 extending along the X-axis direction is fixed to the upper surface of the Y-axis moving plate 10.

An X-axis moving plate 18 is coupled to the upper surface sides of the pair of X-axis guide rails 16 in such a manner as to be slidable along the pair of X-axis guide rails 16. In addition, a threaded shaft 20 extending along the X-axis direction is disposed between the pair of X-axis guide rails 16. A motor 22 for rotating the threaded shaft 20 is coupled to one end portion of the threaded shaft 20.

In addition, on the surface of the threaded shaft 20 in which surface spiral grooves are formed, a nut (not depicted) is provided which houses a large number of balls that roll on the surface of the threaded shaft 20 being rotated. A ball screw is thus formed. That is, when the threaded shaft 20 is rotated, the large number of balls circulate within the nut, and the nut moves along the X-axis direction.

Further, the nut is fixed to the lower surface side of the X-axis moving plate 18. Therefore, when the threaded shaft 20 is rotated by the motor 22, the X-axis moving plate 18 moves along the X-axis direction together with the nut.

A table base 24 in a cylindrical shape is disposed on the upper surface side of the X-axis moving plate 18. A holding table 26 that holds the laminated wafer described above, for example, is disposed on an upper portion of the table base 24. The holding table 26, for example, has a circular upper surface (holding surface) parallel with the X-axis direction and the Y-axis direction. A porous plate 26*a* is exposed on the holding surface.

In addition, a rotational driving source (not depicted) such as a motor is coupled to a lower portion of the table base 24. Then, when this rotational driving source is operated, the holding table 26 rotates with a straight line as a rotational axis which straight line passes through the center of the holding surface and is parallel with the Z-axis direction. In addition, when the horizontal moving mechanism 6 described above is operated, the holding table 26 moves along the X-axis direction and/or the Y-axis direction.

Further, the porous plate 26*a* communicates with a suction source (not depicted) such as an ejector via a flow passage provided within the holding table 26 or the like. Then, when the suction source is operated, a suction force acts on a space in the vicinity of the holding surface of the holding table 26. Therefore, when the suction source is operated in a state in which the laminated wafer described above is placed on the holding table 26, for example, the laminated wafer can be held on the holding table 26.

In addition, a support structure 30 having a side surface substantially parallel with the Y-axis direction and the Z-axis direction is provided in the rear of the horizontal moving mechanism 6. A vertical moving mechanism 32 is disposed on the side surface of the support structure 30. Moreover, the vertical moving mechanism 32 includes a pair of Z-axis guide rails 34 that are fixed to the side surface of the support structure 30 and extend along the Z-axis direction.

A Z-axis moving plate 36 is coupled to the front surface sides of the pair of Z-axis guide rails 34 in such a manner as to be slidable along the pair of Z-axis guide rails 34. In addition, a threaded shaft (not depicted) extending along the Z-axis direction is disposed between the pair of Z-axis guide rails 34. A motor 38 for rotating the threaded shaft is coupled to an upper end portion (one end portion) of the threaded shaft.

In addition, on the surface of the threaded shaft in which surface spiral grooves are formed, a nut (not depicted) is provided which houses a large number of balls that roll on the surface of the threaded shaft being rotated. A ball screw is thus formed. That is, when the threaded shaft is rotated, the large number of balls circulate within the nut, and the nut moves along the Z-axis direction.

Further, this nut is fixed to the back surface side of the Z-axis moving plate 36. Therefore, when the threaded shaft disposed between the pair of Z-axis guide rails 34 is rotated by the motor 38, the Z-axis moving plate 36 moves along the Z-axis direction together with the nut.

Figure 5:
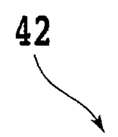
FIG. 5 is a diagram schematically depicting a manner in which a laser beam travels in a laser beam irradiating unit.
Figure 5:
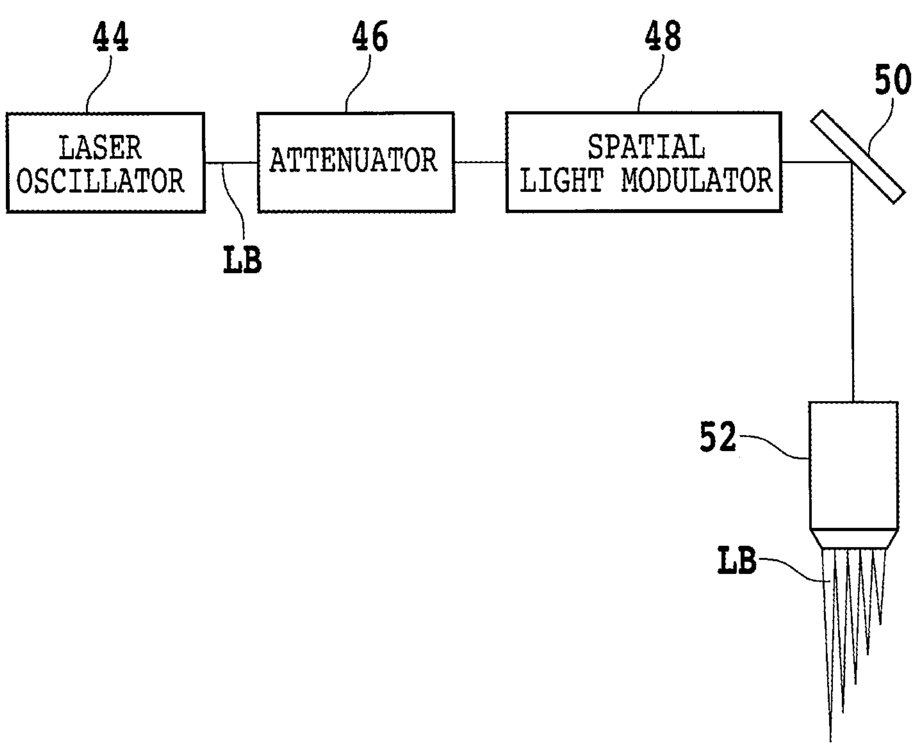

A support 40 is fixed to the front surface side of the Z-axis moving plate 36. The support 40 supports a part of a laser beam irradiating unit 42. FIG. 5 is a diagram schematically depicting a manner in which a laser beam LB travels in the laser beam irradiating unit 42. Incidentally, in FIG. 5, a part of constituent elements of the laser beam irradiating unit 42 are represented by functional blocks.

The laser beam irradiating unit 42 has a laser oscillator 44 that is fixed to the base 4. The laser oscillator 44, for example, has Nd:YAG or the like as a laser medium. The laser oscillator 44 emits the laser beam LB having a wavelength that passes through the wafer 11 (for example, 1064 nm or 1342 nm). The laser beam LB is, for example, a pulsed laser beam having a frequency of 60 kHz.

The laser beam LB is then adjusted in power in an attenuator 46, and is thereafter supplied to a spatial light modulator 48. The spatial light modulator 48 branches the laser beam LB. The spatial light modulator 48, for example, branches the laser beam LB adjusted in the attenuator 46 such that the laser beam LB emitted from an irradiation head 52 to be described later form a plurality of condensing points whose positions (coordinates) in a plane parallel with the X-axis direction and the Y-axis direction (XY coordinate plane) and/or positions (heights) in the Z-axis direction are different from each other.

In addition, the laser beam LB branched in the spatial light modulator 48 is reflected by a mirror 50, and is then guided to the irradiation head 52. The irradiation head 52 houses a condensing lens (not depicted) that condenses the laser beam LB or the like. The laser beam LB condensed by the condensing lens is then emitted to the holding surface side of the holding table 26.

Incidentally, as depicted in FIG. 4, the irradiation head 52 is provided to a front end portion of a housing 54 in a cylindrical shape. Moreover, the support 40 is fixed to a side surface on a rear side of the housing 54. Further, an imaging unit 56 is fixed to a side surface on a front side of the housing 54.

The imaging unit 56, for example, includes a light source such as a light emitting diode (LED), an objective lens, and an imaging element such as a charge coupled device (CCD) image sensor or a complementary metal oxide semiconductor (CMOS) image sensor.

Then, when the vertical moving mechanism 32 described above is operated, the laser beam irradiating unit 42 and the imaging unit 56 move along the Z-axis direction. Further, a cover (not depicted) that covers the constituent elements described above is provided on the base 4. In addition, a touch panel 58 is disposed on the front surface of this cover.

The touch panel 58, for example, includes an input apparatus such as a touch sensor of a capacitive type or a resistive film type and a display apparatus such as a liquid crystal display or an organic electroluminescence (EL) display. The touch panel 58 functions as a user interface.

The laser processing apparatus 2 performs the peeling layer forming step S2 in the following order, for example. Specifically, first, the laminated wafer is placed on the holding table 26 such that the center of the undersurface 17*b* of the support wafer 17 in the laminated wafer described above and the center of the holding surface of the holding table 26 are made to coincide with each other.

Next, the suction source that communicates with the porous plate 26*a* is operated such that the laminated wafer is held by the holding table 26. Next, the imaging unit 56 forms an image by imaging the undersurface 11*b* side of the wafer 11 of the laminated wafer.

Next, this image is referred to to operate the horizontal moving mechanism 6 such that the irradiation head 52 of the laser beam irradiating unit 42 is positioned directly above a region slightly inward of the outer circumferential region of the wafer 11.

In addition, this image may be referred to to operate the rotational driving source coupled to the lower portion of the table base 24 so as to rotate the holding table 26 such that the crystal direction [010] of the single crystal silicon constituting the wafer 11 becomes parallel with the X-axis direction and such that the crystal direction [001] thereof becomes parallel with the Y-axis direction.

Next, a peeling layer (first peeling layer) along the side surface of the circular truncated cone described above is formed in a region inward of the outer circumferential region of the wafer 11. Specifically, first, the laser beam irradiating unit 42 is operated so as to irradiate the wafer 11 with the branched laser beam LB. At this time, the laser beam LB is branched such that the plurality of condensing points are arranged so as to become more distant from the outer circumferential region with increasing distance from the top surface 11*a* of the wafer 11.

Figure 6:
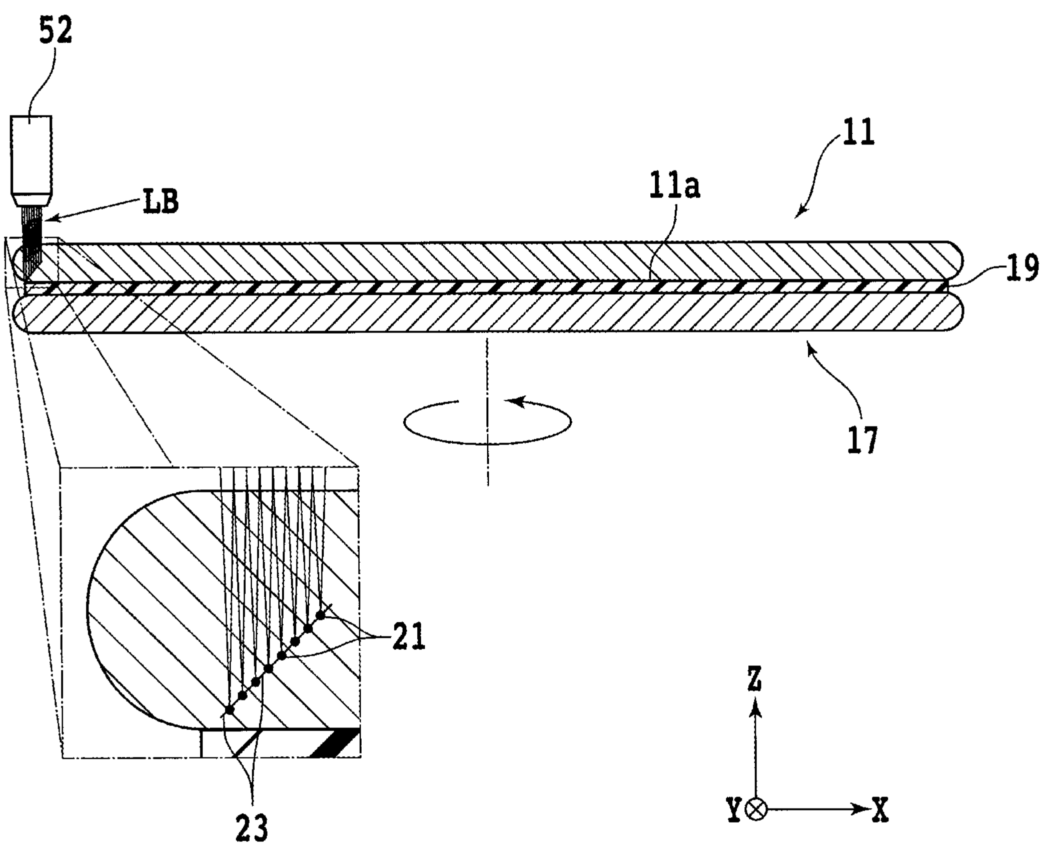
FIG. 6 is a partially sectional front view schematically depicting a manner in which a region inward of an outer circumferential region of the wafer is irradiated with the laser beam.

FIG. 6 is a partially sectional front view schematically depicting a manner in which the region inward of the outer circumferential region of the wafer 11 is irradiated with the laser beam LB. The laser beam LB forms, for example, a plurality of (for example, eight) condensing points such that the positions of adjacent condensing points are shifted from each other by 10 μm within the wafer 11 in each of a radial direction (direction perpendicular to the Z-axis direction) and a thickness direction (Z-axis direction) of the wafer 11.

In this case, a modified portion 21 in which the crystal structure of the material constituting the wafer 11 is disturbed is formed within the wafer 11 so as to be centered at each of the plurality of condensing points. That is, a plurality of modified portions 21 are formed such that the modified portions 21 are arranged in the form of a straight line along the radial direction of the wafer 11 as viewed in plan and such that an acute angle formed between this straight line and the top surface 11*a* of the wafer 11 is 45°.

It is to be noted that the acute angle formed between the plurality of modified portions 21 arranged in the form of a straight line and the top surface 11*a* of the wafer 11 is not limited to 45°. That is, the laser beam LB may be applied to the wafer 11 so as to form the plurality of condensing points such that intervals in the radial direction of the wafer 11 between adjacent condensing points are different from intervals therebetween in the thickness direction of the wafer 11.

However, this angle is preferably equal to or more than 1°. That is, the angle formed between the lower surface and the side surface of the circular truncated cone described above is preferably equal to or more than 1°. It is consequently possible to prevent the devices 15 formed on the top surface 11*a* side of the wafer 11 from being damaged by the laser beam LB when forming a peeling layer along the upper surface of the circular truncated cone described above.

Further, cracks 23 extend from each of the plurality of modified portions 21 so as to connect pairs of modified portions 21 adjacent to each other. Consequently, a peeling layer including the plurality of modified portions 21 and the cracks 23 extending from each of the plurality of modified portions 21 are formed within the wafer 11.

Next, while the laser beam irradiating unit 42 remains operated, the rotational driving source coupled to the lower portion of the table base 24 is operated so as to make the holding table 26 holding the laminated wafer rotate at least once. As a result, a peeling layer (first peeling layer) along the side surface of the circular truncated cone described above is formed in the region inward of the outer circumferential region of the wafer 11.

Next, a peeling layer (second peeling layer) along the upper surface (second base) of the circular truncated cone described above is formed in a region inward of the first peeling layer of the wafer 11. Specifically, first, the horizontal moving mechanism 6 is operated such that the irradiation head 52 of the laser beam irradiating unit 42 is positioned directly above a region slightly inward of the first peeling layer of the wafer 11.

At this time, when necessary, the rotational driving source coupled to the lower portion of the table base 24 may be operated to rotate the holding table 26 such that the crystal direction [010] of the single crystal silicon constituting the wafer 11 becomes parallel with the X-axis direction and such that the crystal direction [001] thereof becomes parallel with the Y-axis direction. Incidentally, the rotation of the holding table 26 is, for example, performed while referring to an image of the undersurface 11*b* side of the wafer 11 which image is formed by the imaging of the imaging unit 56.

Next, the laser beam irradiating unit 42 is operated so as to apply a branched laser beam LB. At this time, the laser beam LB is branched such that all of the plurality of condensing points are positioned at the upper surface (second base) of the circular truncated cone described above.

Figure 7:
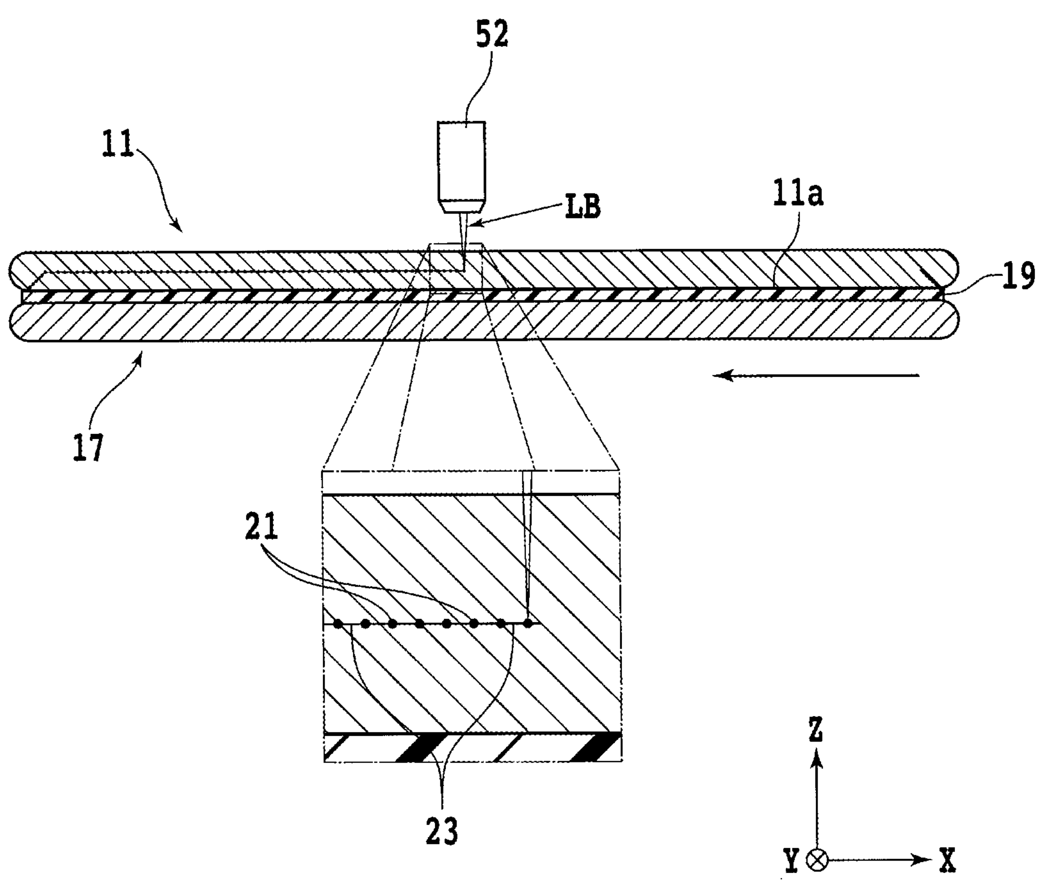
FIG. 7 is a partially sectional front view schematically depicting a manner in which a region inward of a first peeling layer of the wafer is irradiated with the laser beam.

FIG. 7 is a partially sectional front view schematically depicting a manner in which the region inward of the first peeling layer of the wafer 11 is irradiated with the laser beam LB. The laser beam LB is branched so as to form a plurality of (for example, 2 to 10) condensing points arranged at equal intervals (for example, 5 to 15 μm) in the Y-axis direction (crystal direction [001]).

In this case, as described above, a plurality of modified portions 21 and cracks 23 extending from each of the plurality of modified portions 21 are formed within the wafer 11. Next, while the laser beam LB remains applied to the wafer 11, the horizontal moving mechanism 6 is operated so as to move the holding table 26 holding the laminated wafer along the X-axis direction.

As a result, a peeling layer is formed in a linear region along the X-axis direction (crystal direction [010]) which linear region is included in the region inward of the first peeling layer of the wafer 11. Incidentally, the peeling layer can be made wide and thin in a case where the peeling layer is formed by irradiating the linear region along the crystal direction [010] with the laser beam LB that forms the plurality of condensing points arranged along the crystal direction [001].

This will be described in detail in the following. First, in general, single crystal silicon cleaves most easily in a specific crystal plane included in crystal planes {111}, and cleaves second most easily in a specific crystal plane included in crystal planes {110}. Therefore, when the modified portions are formed along a specific crystal direction (for example, a crystal direction [011]) included in crystal directions <110> of the single crystal silicon constituting the wafer 11, for example, many cracks occur which extend from the modified portions along the specific crystal plane included in the crystal planes {111}.

On the other hand, when a plurality of modified portions are formed in a region along a specific crystal direction included in crystal directions <100> of the single crystal silicon so as to be arranged along a direction orthogonal to a direction in which the region extends as viewed in plan, many cracks occur which extend from each of the plurality of modified portions along a crystal plane parallel with the direction in which the region extends among crystal planes {N10} (N is a natural number of 10 or less).

For example, when a plurality of modified portions 21 are formed in a region along the crystal direction [010] so as to be arranged along the crystal direction [001] as described above, cracks are increased which extend from each of the plurality of modified portions 21 along a crystal plane parallel with the crystal direction [010] among the crystal planes {N10}.

Specifically, when the plurality of modified portions 21 are thus formed, cracks tend to extend in the following crystal planes.

$$(101), (201), (301), (401), (501), (601), (701), (801), (901), (\underline{10}01) \quad \text{[Math. 1]}$$

$$(\bar{1}01), (\bar{2}01), (\bar{3}01), (\bar{4}01), (\bar{5}01), (\bar{6}01), (\bar{7}01), (\bar{8}01), (\bar{9}01), (\overline{\underline{10}}01) \quad \text{[Math. 2]}$$

Then, an angle that the crystal plane (100) exposed on the top surface 11*a* and the undersurface 11*b* of the wafer 11 forms with a crystal plane parallel with the crystal direction [010] among the crystal planes {N10} is equal to or less than 45°. On the other hand, an angle that the crystal plane (100) forms with the specific crystal plane included in the crystal planes {111} is approximately 54.7°.

Therefore, in a case where the peeling layer is formed as described above, the peeling layer can be made wide and thin as compared with a case where a plurality of modified portions are formed in a region along the crystal direction [011] of the single crystal silicon so as to be arranged along a direction orthogonal to a direction in which this region extends as viewed in plan.

Next, the horizontal moving mechanism 6 is operated so as to move the holding table 26 holding the laminated wafer along the Y-axis direction. Next, the laser beam irradiating unit 42 and the horizontal moving mechanism 6 are operated so as to form a peeling layer in a linear region parallel with the linear region in which a peeling layer is already formed.

Further, a similar operation is repeated until a peeling layer is formed in all of regions inward of the first peeling layer of the wafer 11. As a result, a peeling layer (second peeling layer) along the upper surface (second base) of the circular truncated cone described above is formed in the region inward of the first peeling layer of the wafer 11. The peeling layer forming step S2 is thereby completed.

Incidentally, the peeling layer forming step S2 may form the second peeling layer, and then form the first peeling layer. That is, the peeling layer forming step S2 may form the second peeling layer by irradiating a plurality of linear regions included in the wafer 11 with the laser beam LB in order, and then form the first peeling layer by irradiating the annular region located on the outside of these regions with the laser beam LB.

Alternatively, in the peeling layer forming step S2, the first peeling layer and the second peeling layer may be formed simultaneously and in parallel with each other. Specifically, the first peeling layer and the second peeling layer may be formed as follows.

First, the irradiation head 52 of the laser beam irradiating unit 42 is positioned directly above a region slightly inward of the outer circumferential region of the wafer 11. Next, the holding table 26 holding the laminated wafer is rotated such that the crystal direction [010] of the single crystal silicon constituting the wafer 11 becomes parallel with the X-axis direction and such that the crystal direction [001] thereof becomes parallel with the Y-axis direction.

Next, the laser beam irradiating unit 42 is operated so as to apply a branched laser beam LB. At this time, the laser beam LB is, for example, branched such that all of the plurality of condensing points are positioned in the vicinity of one end in the X-axis direction in the lower surface of the circular truncated cone described above.

Next, the holding table 26 holding the laminated wafer is moved along the X-axis direction while the positions of the plurality of condensing points are raised until all of the plurality of condensing points are positioned in the vicinity of one end in the X-axis direction in the upper surface of the circular truncated cone described above. Consequently, a part (first inclined portion) of the first peeling layer is formed within a linear region (first region) along the crystal direction [010] which region is included in the wafer 11.

Next, the holding table 26 holding the laminated wafer is moved along the X-axis direction while all of the plurality of condensing points are positioned at the same height as the upper surface of the circular truncated cone described above until all of the plurality of condensing points are positioned in the vicinity of another end in the X-axis direction in the upper surface of the circular truncated cone described above. Consequently, a part (first linear portion) of the second peeling layer is formed within the first region of the wafer 11.

Next, the holding table 26 holding the laminated wafer is moved along the X-axis direction while the positions of the plurality of condensing points are lowered until all of the plurality of condensing points are positioned in the vicinity of another end in the X-axis direction in the lower surface of the circular truncated cone described above. Consequently, another part (first inclined portion) of the first peeling layer is formed within the first region of the wafer 11.

That is, a pair of the first inclined portions and the first linear portion located between the pair of the first inclined portions in the crystal direction [010] are formed within the first region of the wafer 11 by the application of the laser beam LB as described above. Next, the holding table 26 holding the laminated wafer is moved along the Y-axis direction.

Next, the laser beam irradiating unit 42 and the horizontal moving mechanism 6 are operated so as to form another pair of inclined portions (second inclined portions) and another linear portion (second linear portion) in a linear region (second region) parallel with the first region in which the pair of inclined portions and the first linear portion are already formed. The first peeling layer and the second peeling layer are formed simultaneously and in parallel with each other by further repeating a similar operation.

After the peeling layer forming step S2 is performed, the wafer 11 is divided so as to form a thinned wafer that has a side surface (first peeling surface) exposed by being divided at the first peeling layer and has an upper surface (second peeling surface) exposed by being divided at the second peeling layer (dividing step S3).

Figure 8A:
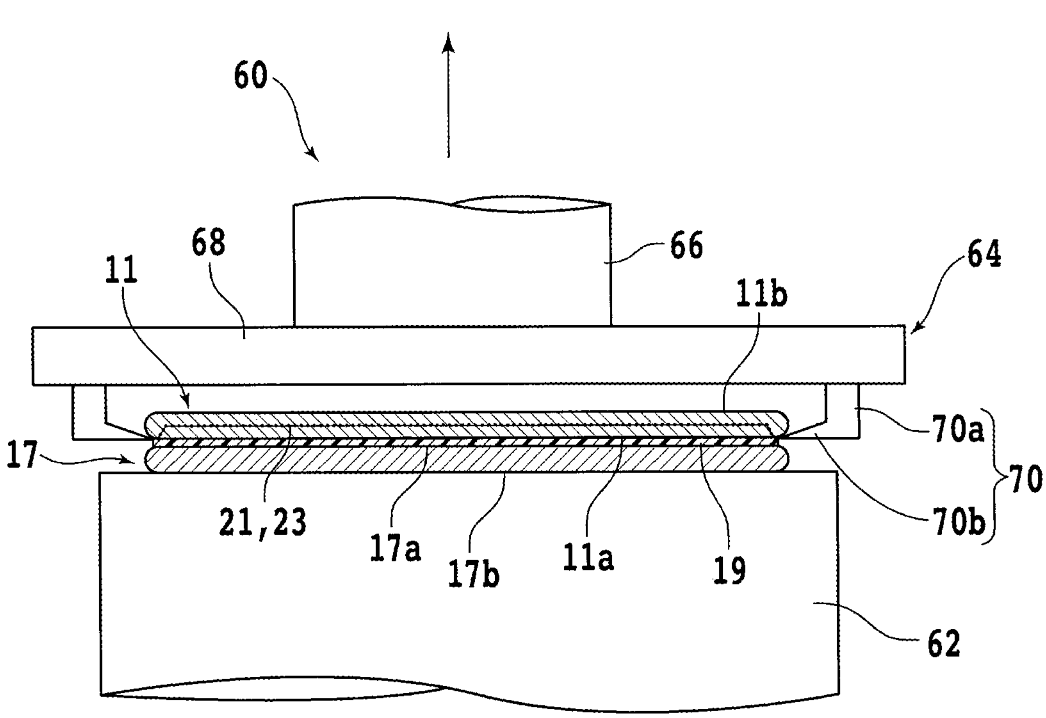
FIG. 8A is a partially sectional front view schematically depicting a manner in which the wafer is divided.
Figure 8B:
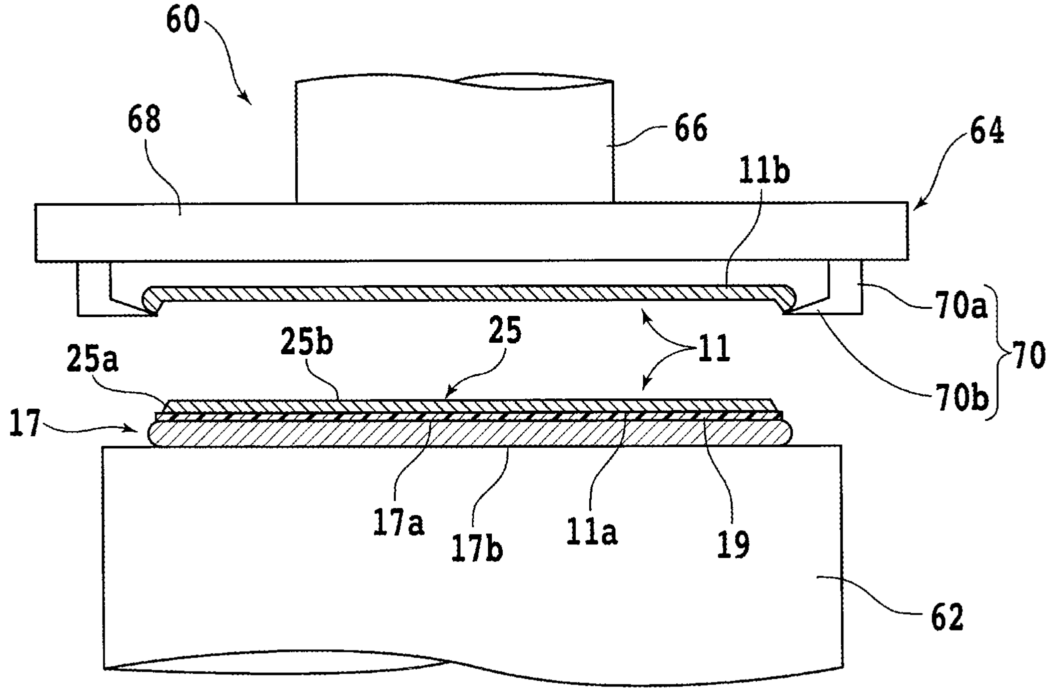
FIG. 8B is a partially sectional front view schematically depicting the manner in which the wafer is divided.

Each of FIG. 8A and FIG. 8B is a partially sectional side view schematically depicting a manner in which the wafer 11 having the first peeling layer and the second peeling layer formed therein is divided. This dividing step S3 is, for example, performed in a dividing apparatus 60 depicted in FIG. 8A and FIG. 8B.

The dividing apparatus 60 includes a holding table 62 that holds the laminated wafer including the wafer 11. The holding table 62 has a circular upper surface (holding surface). A porous plate (not depicted) is exposed on the holding surface. Further, this porous plate communicates with a suction source (not depicted) such as an ejector via a flow passage provided within the holding table 62 or the like.

Then, when the suction source is operated, a suction force acts on a space in the vicinity of the holding surface of the holding table 62. Therefore, when the suction source is operated in a state in which the laminated wafer described above is placed on the holding table 62, for example, the laminated wafer can be held on the holding table 62.

In addition, a dividing unit 64 is provided above the holding table 62. The dividing unit 64 has a support member 66 in a cylindrical shape. A ball screw type raising and lowering mechanism (not depicted), for example, is coupled to an upper portion of the support member 66. The dividing unit 64 is raised or lowered by operating the raising and lowering mechanism.

In addition, a lower end portion of the support member 66 is fixed to the center of an upper portion of a support base 68 having a disk shape. A plurality of movable members 70 are provided to a lower side of an outer circumferential region of the support base 68 at substantially equal angular intervals along the circumferential direction of the support base 68. The movable members 70 have a plate-shaped hanging portion 70*a* that extends downward.

An upper end portion of the hanging portion 70*a* is coupled to an actuator such as an air cylinder included in the support base 68. The movable member 70 is moved along the radial direction of the support base 68 by operating this actuator. In addition, an inner surface of a lower end portion of the hanging portion 70*a* is provided with a plate-shaped pawl portion 70*b* that extends toward the center of the support base 68 and decreases in thickness toward the center of the support base 68.

The dividing apparatus 60 performs the dividing step S3 in the following order, for example. Specifically, first, the laminated wafer is placed on the holding table 62 such that the center of the undersurface 17*b* of the support wafer 17 included in the laminated wafer including the wafer 11 having the first peeling layer and the second peeling layer formed therein and the center of the holding surface of the holding table 62 are made to coincide with each other.

Next, the suction source communicating with the porous plate exposed on the holding surface is operated such that the laminated wafer is held by the holding table 62. Next, the actuator is operated so as to position each of the plurality of movable members 70 on the outside in the radial direction of the support base 68.

Next, the raising and lowering mechanism is operated so as to position a distal end of the pawl portion 70*b* of each of the plurality of movable members 70 at a height corresponding to the adhesive 19 of the laminated wafer. Next, the actuator is operated so as to bring the pawl portion 70*b* into contact with the laminated wafer. Next, the raising and lowering mechanism is operated so as to raise the pawl portion 70*b* (see FIG. 8A).

Consequently, an upward external force, that is, an external force along the thickness direction of the wafer 11 is applied to the outer circumferential region of the wafer 11. As a result, the cracks 23 included in the first peeling layer and the second peeling layer further extend to divide the wafer 11. The region in which the plurality of devices 15 of the wafer 11 are formed and the outer circumferential region are separated from each other, and the top surface 11*a* side and the undersurface 11*b* side of the wafer 11 are separated from each other (see FIG. 8B).

That is, a thinned wafer 25 is formed which has a side surface (first peeling surface) 25*a* exposed by being divided at the first peeling layer and has an upper surface (second peeling surface) 25*b* exposed by being divided at the second peeling layer. Incidentally, unevenness reflecting the shape of the cracks 23 included in the first peeling layer is present on the side surface 25*a*, and unevenness reflecting the shape of the cracks 23 included in the second peeling layer is present on the upper surface 25*b*. The dividing step S3 is thereby completed.

After the dividing step S3 is performed, the upper surface (second peeling surface) 25*b* of the thinned wafer 25 is subjected to grinding (grinding step S4). In addition, after this grinding step S4 is performed, the side surface 25*a* and the upper surface 25*b* of the thinned wafer 25 are subjected to polishing (polishing step S5).

Figure 9:
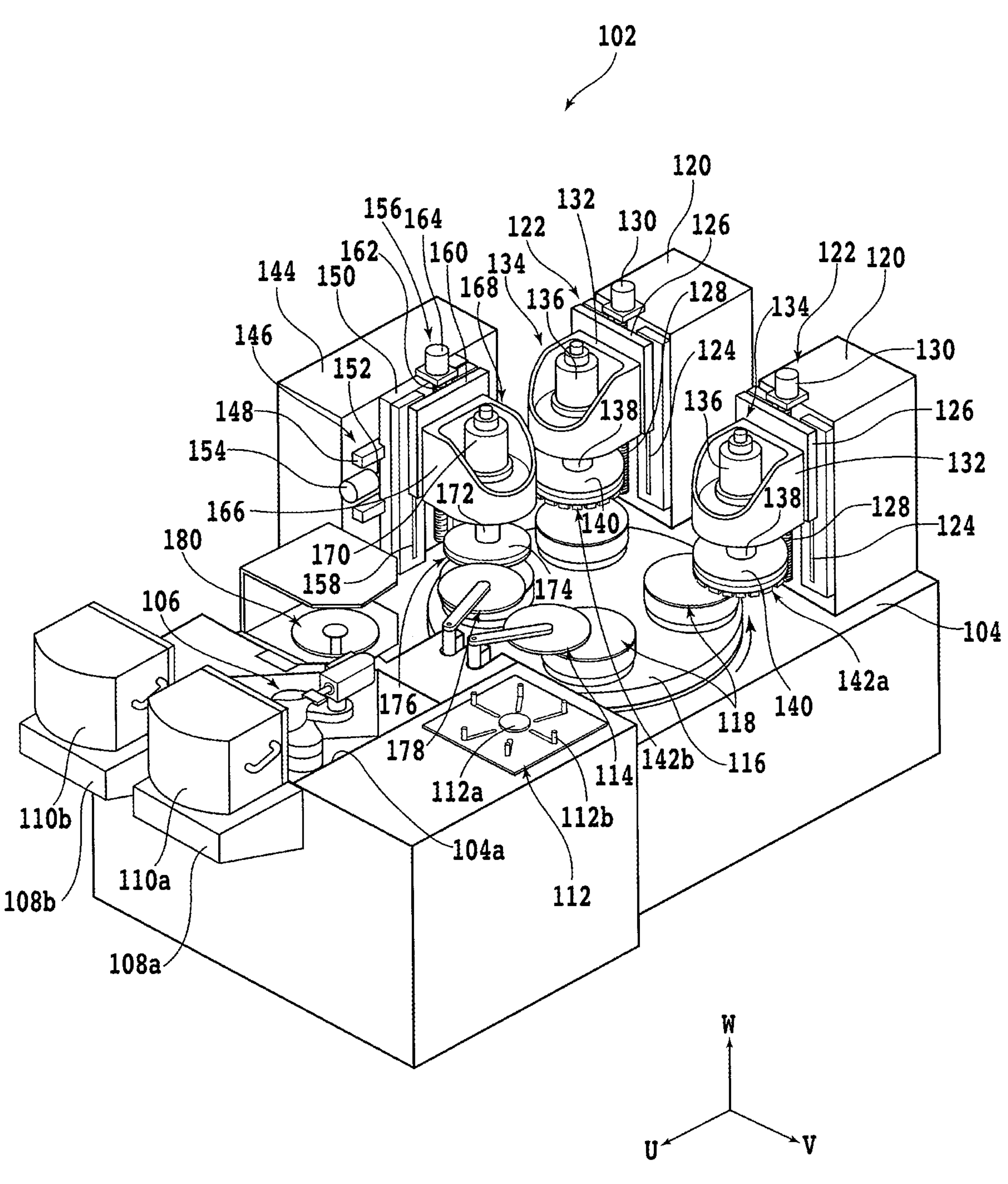
FIG. 9 is a perspective view schematically depicting an example of a processing apparatus.

FIG. 9 is a perspective view schematically depicting an example of a processing apparatus used in the grinding step S4 and the polishing step S5. Incidentally, a U-axis direction and a V-axis direction depicted in FIG. 9 are directions orthogonal to each other on a horizontal plane, and a W-axis direction (upward-downward direction) is a direction (vertical direction) orthogonal to each of the U-axis direction and the V-axis direction.

The processing apparatus 102 depicted in FIG. 9 has a base 104 that supports various structures. An opening 104*a* is formed on a front side of an upper surface of the base 104. A transporting mechanism 106 that transports the laminated wafer including the thinned wafer 25 in a state in which the transporting mechanism 106 sucks and holds the laminated wafer is provided within the opening 104*a*. Further, the transporting mechanism 106 can vertically invert the laminated wafer in a state in which the transporting mechanism 106 holds the laminated wafer.

In addition, cassette tables 108*a* and 108*b* are provided in front of the opening 104*a*. Cassettes 110*a* and 110*b* that can house a plurality of laminated wafers are respectively placed on the cassette tables 108*a* and 108*b*. In addition, a position adjusting mechanism 112 for adjusting the position of a laminated wafer is provided obliquely rearward of the opening 104*a*.

The position adjusting mechanism 112, for example, includes a table 112*a* configured to be able to support the part of the center of the laminated wafer, and a plurality of pins 112*b* configured to be able to approach and separate from the table 112*a* on the outside of the table 112*a*. The laminated wafer unloaded from the cassette 110*a* by the transporting mechanism 106, for example, is loaded onto the table 112*a*.

Then, the position adjusting mechanism 112 performs positioning of the laminated wafer loaded onto the table 112*a*. Specifically, the position of the center of the laminated wafer is set at a predetermined position in a plane parallel with the U-axis direction and the V-axis direction (UV plane) by making the plurality of pins 112*b* approach the table 112*a* until the plurality of pins 112*b* come into contact with the side surface of the laminated wafer loaded onto the table 112*a*.

In addition, a transporting mechanism 114 that swings and transports the laminated wafer in a state in which the transporting mechanism 114 sucks and holds the laminated wafer is provided in the vicinity of the position adjusting mechanism 112. The transporting mechanism 114 includes a suction pad that can suck the upper surface side of the laminated wafer. The transporting mechanism 114 transports the laminated wafer adjusted in position by the position adjusting mechanism 112 in a rearward direction. In addition, a turntable 116 in a disk shape is provided in the rear of the transporting mechanism 114.

The turntable 116 is coupled to a rotational driving source (not depicted) such as a motor. Then, when this rotational driving source is operated, the turntable 116 rotates with a straight line as a rotational axis which straight line passes through the center of the turntable 116 and is parallel with the W-axis direction. In addition, a plurality of (for example, four) holding tables 118 are provided to the upper surface of the turntable 116 at substantially equal intervals along the circumferential direction of the turntable 116.

Then, the transporting mechanism 114 unloads the laminated wafer from the table 112*a* of the position adjusting mechanism 112, and loads the laminated wafer onto a holding table 118 disposed at a loading and unloading position in the vicinity of the transporting mechanism 114. The turntable 116, for example, rotates in the direction of an arrow depicted in FIG. 9, and moves each holding table 118 to the loading and unloading position, a rough grinding position, a finish grinding position, and a polishing position in this order.

Further, the holding table 118 is coupled to a suction source (not depicted) such as an ejector. Then, when this suction source is operated, a suction force acts on a space in the vicinity of the upper surface (holding surface) of the holding table 118. Therefore, when the suction source is operated in a state in which the laminated wafer is placed on the holding table 118, the laminated wafer can be held on the holding table 118.

In addition, the holding table 118 is coupled to a rotational driving source (not depicted) such as a motor. Then, when this rotational driving source is operated, the holding table 118 rotates with a straight line as a rotational axis which straight line passes through the center of the holding table 118 and is parallel with the W-axis direction.

A support structure 120 in a columnar shape is provided in the rear of each of the rough grinding position and the finish grinding position (in the rear of the turntable 116). In addition, a W-axis moving mechanism 122 is provided to a front surface (surface on the turntable 116 side) of the support structure 120. The W-axis moving mechanism 122 includes a pair of W-axis guide rails 124 fixed to the front surface of the support structure 120 and extending along the W-axis direction.

In addition, a W-axis moving plate 126 is coupled to the front surface sides of the pair of W-axis guide rails 124 in such a manner as to be slidable along the pair of W-axis guide rails 124. In addition, a threaded shaft 128 extending along the W-axis direction is disposed between the pair of W-axis guide rails 124. A motor 130 for rotating the threaded shaft 128 is coupled to an upper end portion of the threaded shaft 128.

Moreover, on the surface of the threaded shaft 128 in which surface spiral grooves are formed, a nut (not depicted) is provided which houses a large number of balls that roll on the surface of the threaded shaft 128 being rotated. A ball screw is thus formed. That is, when the threaded shaft 128 is rotated, the large number of balls circulate within the nut, and the nut moves along the W-axis direction.

In addition, this nut is fixed to the rear surface (back surface) side of the W-axis moving plate 126. Therefore, when the threaded shaft 128 is rotated by the motor 130, the W-axis moving plate 126 moves along the W-axis direction together with the nut. Further, a fixture 132 is provided to the front surface (front) of the W-axis moving plate 126.

The fixture 132 supports a grinding unit 134 for subjecting the upper surface 25*b* of the thinned wafer 25 to grinding. The grinding unit 134 includes a spindle housing 136 fixed to the fixture 132. A spindle 138 extending along the W-axis direction is housed in a rotatable manner in the spindle housing 136.

Moreover, a rotational driving source (not depicted) such as a motor is coupled to an upper end portion of the spindle 138. The spindle 138 can be rotated by the power of the rotational driving source with a straight line as a rotational axis which straight line is parallel with the W-axis direction. In addition, a lower end portion of the spindle 138 is exposed from the lower surface of the spindle housing 136. A mount 140 in a disk shape is fixed to the lower end portion.

The lower surface of the mount 140 of the grinding unit 134 on the rough grinding position side is fitted with a grinding wheel 142*a* for rough grinding. The grinding wheel 142*a* for rough grinding includes a disk-shaped wheel base having a substantially same diameter as the mount 140. Moreover, a plurality of grinding stones (grinding stones for rough grinding) each having a rectangular parallelepipedic shape are fixed to the lower surface of the wheel base.

Similarly, the lower surface of the mount 140 of the grinding unit 134 on the finish grinding position side is fitted with a grinding wheel 142*b* for finish grinding. The grinding wheel 142*b* for finish grinding includes a disk-shaped wheel base having a substantially same diameter as the mount 140. Moreover, a plurality of grinding stones (grinding stones for finish grinding) each having a rectangular parallelepipedic shape are fixed to the lower surface of the wheel base.

Moreover, each of the grinding stones for rough grinding and the grinding stones for finish grinding, for example, includes abrasive grains formed of diamond, cubic boron nitride (cBN), or the like and a binding material holding the abrasive grains. In addition, a metal bond, a resin bond, a vitrified bond, or the like, for example, is used as the binding material.

Incidentally, an average particle size of the abrasive grains included in the grinding stones for finish grinding is generally smaller than an average particle size of the abrasive grains included in the grinding stones for rough grinding. For example, the average particle size of the abrasive grains included in the grinding stones for rough grinding is equal to or more than 0.5 μm and equal to or less than 30 μm, and the average particle size of the abrasive grains included in the grinding stones for finish grinding is less than 0.5 μm.

Further, a grinding liquid supply nozzle (not depicted) for supplying a liquid (grinding liquid) such as pure water to a processing point at a time of grinding of the upper surface 25*b* of the thinned wafer 25 is disposed in the vicinities of the grinding wheels 142*a* and 142*b*. Alternatively, in place of or in addition to this grinding liquid supply nozzle, the grinding wheels 142*a* and 142*b* may be provided with an opening for supplying the liquid, and the grinding liquid may be supplied to the processing point via the opening.

In addition, a support structure 144 is provided on a side of the polishing position (on a side of the turntable 116). Moreover, a U-axis moving mechanism 146 is provided to a side surface on the turntable 116 side of the support structure 144. The U-axis moving mechanism 146 includes a pair of U-axis guide rails 148 that are fixed to the side surface on the turntable 116 side of the support structure 144 and extend along the U-axis direction.

In addition, a U-axis moving plate 150 is coupled to the turntable 116 sides of the pair of U-axis guide rails 148 in such a manner as to be slidable along the pair of U-axis guide rails 148. In addition, a threaded shaft 152 extending along the U-axis direction is disposed between the pair of U-axis guide rails 148. A motor 154 for rotating the threaded shaft 152 is coupled to a front end portion of the threaded shaft 152.

Moreover, on the surface of the threaded shaft 152 in which surface spiral grooves are formed, a nut (not depicted) is provided which houses a large number of balls that roll on the surface of the threaded shaft 152 being rotated. A ball screw is thus formed. That is, when the threaded shaft 152 is rotated, the large number of balls circulate within the nut, and the nut moves along the U-axis direction.

In addition, this nut is fixed to a surface (back surface) side of the U-axis moving plate 150 which surface side faces the support structure 144. Therefore, when the threaded shaft 152 is rotated by the motor 154, the U-axis moving plate 150 moves along the U-axis direction together with the nut. Further, a W-axis moving mechanism 156 is provided to a surface on the turntable 116 side (front surface) of the U-axis moving plate 150.

The W-axis moving mechanism 156 includes a pair of W-axis guide rails 158 that are fixed to the front surface of the U-axis moving plate 150 and extend along the W-axis direction. In addition, a W-axis moving plate 160 is coupled to the turntable 116 sides of the pair of W-axis guide rails 158 in such a manner as to be slidable along the pair of W-axis guide rails 158.

In addition, a threaded shaft 162 extending along the W-axis direction is disposed between the pair of W-axis guide rails 158. A motor 164 for rotating the threaded shaft 162 is coupled to an upper end portion of the threaded shaft 162. Moreover, on the surface of the threaded shaft 162 in which surface spiral grooves are formed, a nut (not depicted) is provided which houses a large number of balls that roll on the surface of the threaded shaft 162 being rotated. A ball screw is thus formed.

That is, when the threaded shaft 162 is rotated, the large number of balls circulate within the nut, and the nut moves along the W-axis direction. In addition, this nut is fixed to a surface (back surface) side of the W-axis moving plate 160 which surface side faces the U-axis moving plate 150.

Therefore, when the threaded shaft 162 is rotated by the motor 164, the W-axis moving plate 160 moves along the W-axis direction together with the nut.

Further, a fixture 166 is provided to a surface on the turntable 116 side (front surface) of the W-axis moving plate 160. The fixture 166 supports a polishing unit 168 for subjecting the side surface 25*a* and the upper surface 25*b* of the thinned wafer 25 to polishing. The polishing unit 168 includes a spindle housing 170 fixed to the fixture 166.

A spindle 172 extending along the W-axis direction is housed in a rotatable manner in the spindle housing 170. Moreover, a rotational driving source (not depicted) such as a motor is coupled to an upper end portion of the spindle 172. The spindle 172 is rotated by the power of the rotational driving source.

In addition, a lower end portion of the spindle 172 is exposed from the lower surface of the spindle housing 170. A mount 174 in a disk shape is fixed to the lower end portion. The lower surface of the mount 174 is fitted with a polishing pad 176 in a disk shape. The polishing pad 176 has a disk-shaped base having a substantially same diameter as the mount 174.

Moreover, a disk-shaped polishing layer having a substantially same diameter as the mount 174 is fixed to the lower surface of this base. This polishing layer is a fixed abrasive grain layer having abrasive grains dispersed therewithin. For example, the polishing layer is manufactured by impregnating a nonwoven fabric made of polyester with a urethane solution in which abrasive grains having an average particle size of 0.4 to 0.6 μm are dispersed, and thereafter drying the nonwoven fabric.

Incidentally, the abrasive grains dispersed within the polishing layer are formed of a material such as SiC, cBN, diamond, or metal oxide particulates. In addition, particulates formed of $SiO_2$ (silica), $CeO_2$ (ceria), $ZrO_2$ (zirconia), or $Al_2O_3$ (alumina) are used as the metal oxide particulates.

In addition, the polishing layer is soft, and is thus elastically deformed according to a pressure applied at a time of polishing. For example, according to a pressure applied at a time of polishing the upper surface 25*b* of the thinned wafer 25, the polishing layer is elastically deformed so as to bury the thinned wafer 25 in the polishing layer, that is, so as to cover the side surface 25*a* of the thinned wafer 25. In this case, the side surface 25*a* of the thinned wafer 25 is subjected to polishing together with the upper surface 25*b* of the thinned wafer 25.

Incidentally, an angle formed between the upper surface 25*b* and the side surface 25*a* is preferably equal to or more than 1000 in order to thus polish the side surface 25*a* of the thinned wafer 25 together with the upper surface 25*b* of the thinned wafer 25. In other words, an angle formed between the side surface and the upper surface of the circular truncated cone described above is preferably equal to or more than 100°, that is, an angle formed between the lower surface and the side surface of the circular truncated cone described above is preferably equal to or less than 80°.

Further, central positions in a radial direction of the spindle 172, the mount 174, and the base and the polishing layer of the polishing pad 176 substantially coincide with one another. A through hole in a cylindrical shape is formed so as to pass through these central positions. Moreover, this through hole communicates with a polishing liquid supply source (not depicted) that supplies a liquid (polishing liquid) such as pure water to a processing point at a time of polishing the side surface 25*a* and the upper surface 25*b* of the thinned wafer 25.

This polishing liquid supply source has a polishing liquid tank and a liquid feeding pump or the like. In addition, the polishing liquid supply source supplies the polishing liquid toward the holding table 118 located at the polishing position via the through hole formed in the spindle 172 and the like. Incidentally, the polishing liquid may contain abrasive grains, or may not contain abrasive grains.

In addition, a transporting mechanism 178 that swings and transports the laminated wafer in a state in which the transporting mechanism 178 sucks and holds the laminated wafer is provided on a side of the transporting mechanism 114. The transporting mechanism 178 includes a suction pad that can suck the upper surface side of the laminated wafer. The transporting mechanism 178 transports the laminated wafer placed on the holding table 118 located at the loading and unloading position in a frontward direction.

In addition, a cleaning mechanism 180 configured to be able to clean the upper surface side of the laminated wafer unloaded by the transporting mechanism 178 is disposed in front of the transporting mechanism 178 and on a rear side of the opening 104*a*. In addition, the laminated wafer cleaned by the cleaning mechanism 180 is transported by the transporting mechanism 106 to be housed in the cassette 110*b*, for example.

The processing apparatus 102 performs the grinding step S4 and the polishing step S5 in the following order, for example. First, the transporting mechanism 106 unloads the laminated wafer including the thinned wafer 25 from the cassette 110*a*, and loads the laminated wafer onto the table 112*a* of the position adjusting mechanism 112 such that the thinned wafer 25 is on an upper side. Next, positioning of the laminated wafer is performed by bringing the plurality of pins 112*b* into contact with the laminated wafer.

Next, the transporting mechanism 114 unloads the laminated wafer from the table 112*a*, and loads the laminated wafer onto a holding table 118 disposed at the loading and unloading position such that the thinned wafer 25 is on an upper side. Next, the holding table 118 on which the laminated wafer is loaded sucks and holds the support wafer 17 side of the laminated wafer.

Figure 10:
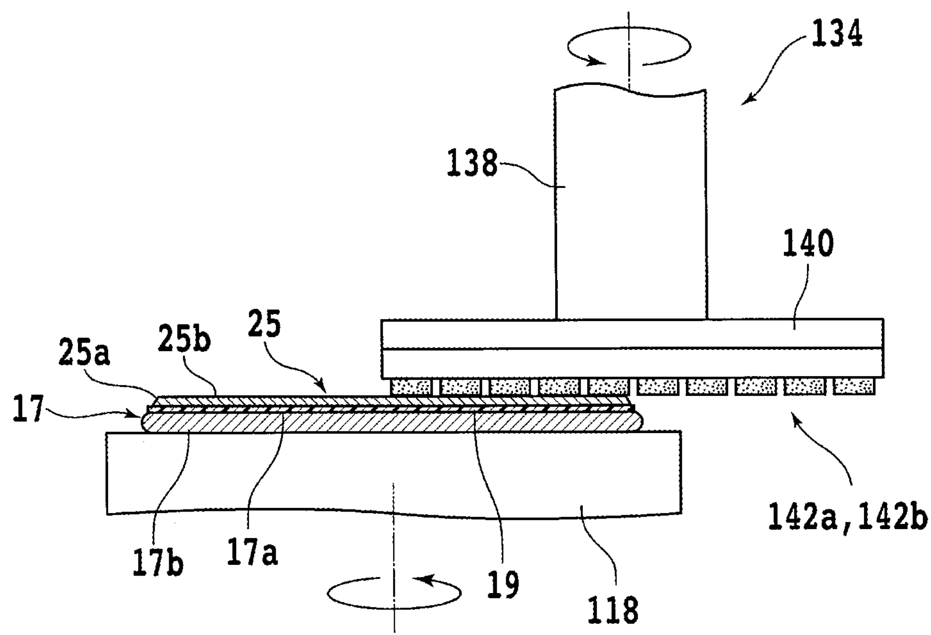
FIG. 10 is a partially sectional side view schematically depicting a manner in which the upper surface of a thinned wafer is subjected to grinding.

Next, as depicted in FIG. 10, the upper surface (second peeling surface) 25*b* of the thinned wafer 25 is subjected to grinding. Specifically, first, the turntable 116 is rotated so as to position the holding table 118 holding the laminated wafer at the rough grinding position.

Next, while both the holding table 118 and the spindle 138 of the grinding unit 134 on the rough grinding position side are rotated, the grinding unit 134 on the rough grinding position side is lowered so as to bring the grinding stones of the grinding wheel 142*a* and the upper surface 25*b* of the thinned wafer 25 into contact with each other.

The upper surface 25*b* of the thinned wafer 25 is thereby subjected to rough grinding, so that the unevenness of the upper surface 25*b* is alleviated. At this time, the grinding liquid is supplied to a contact interface (processing point) between the grinding stones of the grinding wheel 142*a* and the upper surface 25*b* of the thinned wafer 25.

Next, the grinding unit 134 on the rough grinding position side is raised so as to separate the grinding stones of the grinding wheel 142*a* and the upper surface 25*b* of the thinned wafer 25 from each other. Next, the rotation of both the holding table 118 and the spindle 138 of the grinding unit 134 on the rough grinding position side is stopped.

Next, the turntable 116 is rotated so as to position the holding table 118 holding the laminated wafer at the finish grinding position. Next, while both the holding table 118 and the spindle 138 of the grinding unit 134 on the finish grinding position side are rotated, the grinding unit 134 on the finish grinding position side is lowered so as to bring the grinding stones of the grinding wheel 142*b* and the upper surface 25*b* of the thinned wafer 25 into contact with each other.

The upper surface 25*b* of the thinned wafer 25 is thereby subjected to finish grinding, so that the unevenness of the upper surface 25*b* is further alleviated. At this time, the grinding liquid is supplied to a contact interface (processing point) between the grinding stones of the grinding wheel 142*b* and the upper surface 25*b* of the thinned wafer 25.

Next, the grinding unit 134 on the finish grinding position side is raised so as to separate the grinding stones of the grinding wheel 142*b* and the upper surface 25*b* of the thinned wafer 25 from each other. Next, the rotation of both the holding table 118 and the spindle 138 of the grinding unit 134 on the finish grinding position side is stopped. The grinding step S4 is thereby completed.

Figure 11:
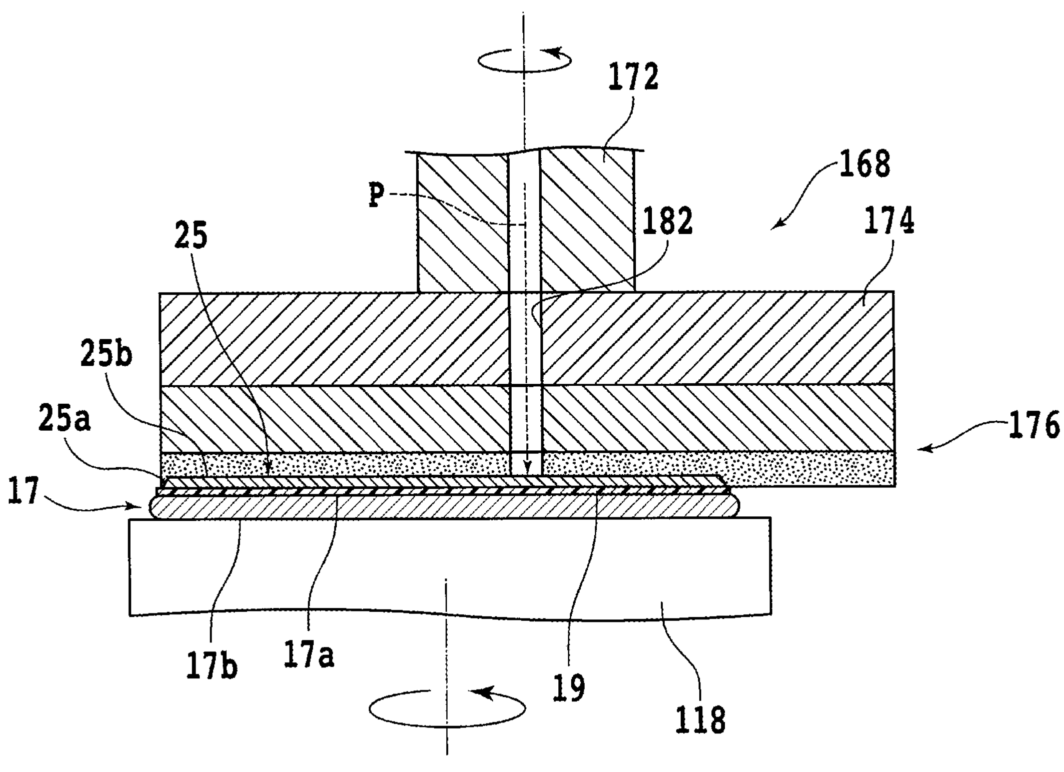
FIG. 11 is a partially sectional side view schematically depicting a manner in which the side surface and upper surface of the thinned wafer are subjected to polishing.

Next, as depicted in FIG. 11, the side surface (first peeling surface) and the upper surface (second peeling surface) 25*b* of the thinned wafer 25 are subjected to polishing. Specifically, first, the turntable 116 is rotated so as to position the holding table 118 holding the laminated wafer at the polishing position.

Next, while both the holding table 118 and the spindle 172 of the polishing unit 168 are rotated, the polishing unit 168 is lowered until the polishing layer is elastically deformed so as to bury the thinned wafer 25 in the polishing layer of the polishing pad 176, that is, so as to cover the side surface 25*a* and the upper surface 25*b* of the thinned wafer 25.

The side surface 25*a* and the upper surface 25*b* of the thinned wafer 25 are thereby polished, so that each of the side surface 25*a* and the upper surface 25*b* is planarized. At this time, a polishing liquid P is supplied from the polishing liquid supply source to the side surface 25*a* and the upper surface 25*b* of the thinned wafer 25 via a through hole 182 that penetrates the spindle 172, the mount 174, and the polishing pad 176.

Next, the polishing unit 168 is raised so as to separate the polishing layer of the polishing pad 176 from the side surface 25*a* and the upper surface 25*b* of the thinned wafer 25. Next, the rotation of both the holding table 118 and the spindle 172 is stopped. The polishing step S5 is thereby completed.

Next, the turntable 116 is rotated so as to position the holding table 118 holding the laminated wafer at the loading and unloading position. Next, the holding table 118 positioned at the loading and unloading position stops the suction of the support wafer 17 side of the laminated wafer.

Next, the transporting mechanism 178 unloads the laminated wafer from the holding table 118, and loads the laminated wafer onto the cleaning mechanism 180 such that the thinned wafer 25 is on an upper side. Next, the cleaning mechanism 180 cleans the side surface 25*a* and the upper surface 25*b* of the laminated wafer. Next, the transporting mechanism 106 loads the laminated wafer into the cassette 110*b*.

In the wafer processing method depicted in FIG. 2, the first peeling layer along the side surface of the circular truncated cone and the second peeling layer along the upper surface of the circular truncated cone are formed within the wafer 11, the circular truncated cone being defined by the lower surface (first base) located on the top surface 11*a* side of the wafer 11, the side surface that has one end coinciding with the outer circumference of the lower surface and is inclined so as to become more distant from the outer circumferential region with increasing distance from the top surface 11*a* side of the wafer 11, and the upper surface (second base) that has an outer circumference coinciding another end of the side surface and is parallel with the lower surface.

Then, in this method, the wafer 11 is divided so as to form the thinned wafer 25 that has the side surface (first peeling surface) 25*a* exposed by being divided at the first peeling layer and the upper surface (second peeling surface) 25*b* exposed by being divided at the second peeling layer.

Here, in the wafer 11, the first peeling layer is formed so as to be along the side surface of the circular truncated cone. In this case, there is a low probability that the side surface 25*a* of the thinned wafer 25 and the inner surface of a remaining part (part including the outer circumferential region) of the wafer 11 come into contact with each other when the wafer 11 is divided. This method can therefore suppress the occurrence of a crack due to the contact between both.

Further, in the wafer 11, cracks tend to extend in a direction along the side surface of the circular truncated cone from the first peeling layer. In this case, there is a low probability that cracks extend toward the devices 15 formed on the top surface side of the thinned wafer 25. This method can therefore suppress damage to the devices 15 which damage may accompany the formation of the thinned wafer 25 and suppress a decrease in the number of chips that can be manufactured from the wafer 11.

It is to be noted that the wafer processing method described above is one aspect of the present invention, and that the present invention is not limited to the method described above. For example, in the present invention, the laminating step S1 may not be performed. That is, the present invention may be a wafer processing method that forms the thinned wafer 25 by dividing a single wafer 11.

In addition, in the laminating step S1 according to the present invention, the top surface 11*a* of the wafer 11 and the top surface 17*a* side of the support wafer 17 may be laminated to each other without the use of the adhesive 19. For example, the laminating step S1 according to the present invention may be performed by bringing the two top surfaces 11*a* and 17*a* into contact with each other in a state in which foreign matter on each of the top surfaces 11*a* and 17*a* is removed and each of the top surfaces 11*a* and 17*a* is activated.

In addition, in the present invention, the top surface 11*a* side of the wafer 11 may be laminated to the top surface 17*a* side of the support wafer 17 after the first peeling layer and the second peeling layer are formed in the wafer 11. That is, in the present invention, the laminating step S1 may be performed after the peeling layer forming step S2 is performed.

In addition, the structure of the laser processing apparatus used in the peeling layer forming step S2 according to the present invention is not limited to the structure of the laser processing apparatus 2 described above. For example, the peeling layer forming step S2 according to the present invention may be performed by using a laser processing apparatus provided with a horizontal moving mechanism that moves the irradiation head 52 of the laser beam irradiating unit 42 and the like along each of the X-axis direction and/or the Y-axis direction.

Alternatively, the peeling layer forming step S2 according to the present invention may be performed by using a laser processing apparatus in which the laser beam irradiating unit 42 is provided with a scanning optical system capable of changing the direction of the laser beam LB applied from the irradiation head 52. Incidentally, the scanning optical system, for example, includes a galvanoscanner, an acoustooptic element (AOD), and/or a polygon mirror or the like.

That is, in the laser processing apparatus used in the peeling layer forming step S2 according to the present invention, it suffices to be able to move the holding table 26 and the condensing point at which the laser beam LB is condensed relative to each other along each of the X-axis direction, the Y-axis direction, and the Z-axis direction, and there is no limitation on the structure for this purpose.

In addition, in the peeling layer forming step S2 according to the present invention, a method of forming the first peeling layer is not limited to the method described above. For example, in the peeling layer forming step S2 according to the present invention, the first peeling layer may be formed by annularly irradiating the wafer 11 with the laser beam LB through an operation of the horizontal moving mechanism 6 in place of the rotational driving source coupled to the lower portion of the table base 24.

In addition, in the peeling layer forming step S2 according to the present invention, the first peeling layer may be formed by irradiating the wafer 11 with the laser beam LB that is not branched. In this case, it suffices, for example, to move the condensing point at which the laser beam LB is condensed and the wafer 11 relative to each other so as to describe a locus as of a spiral staircase with a radius of gyration decreased toward an upper side within the wafer 11.

In addition, in the peeling layer forming step S2 according to the present invention, a method of forming the second peeling layer is not limited to the method described above. For example, in the peeling layer forming step S2 according to the present invention, the second peeling layer may be formed by spirally irradiating the wafer 11 with the laser beam LB through an operation of the rotational driving source coupled to the lower portion of the table base 24 in addition to the horizontal moving mechanism 6.

In addition, in the dividing step S3 according to the present invention, an ultrasonic wave may be applied to the wafer 11 before the division of the wafer 11 having the first peeling layer and the second peeling layer formed therein. In this case, the cracks 23 included in the first peeling layer and the second peeling layer extend, so that the division of the wafer 11 is facilitated.

Figure 12:
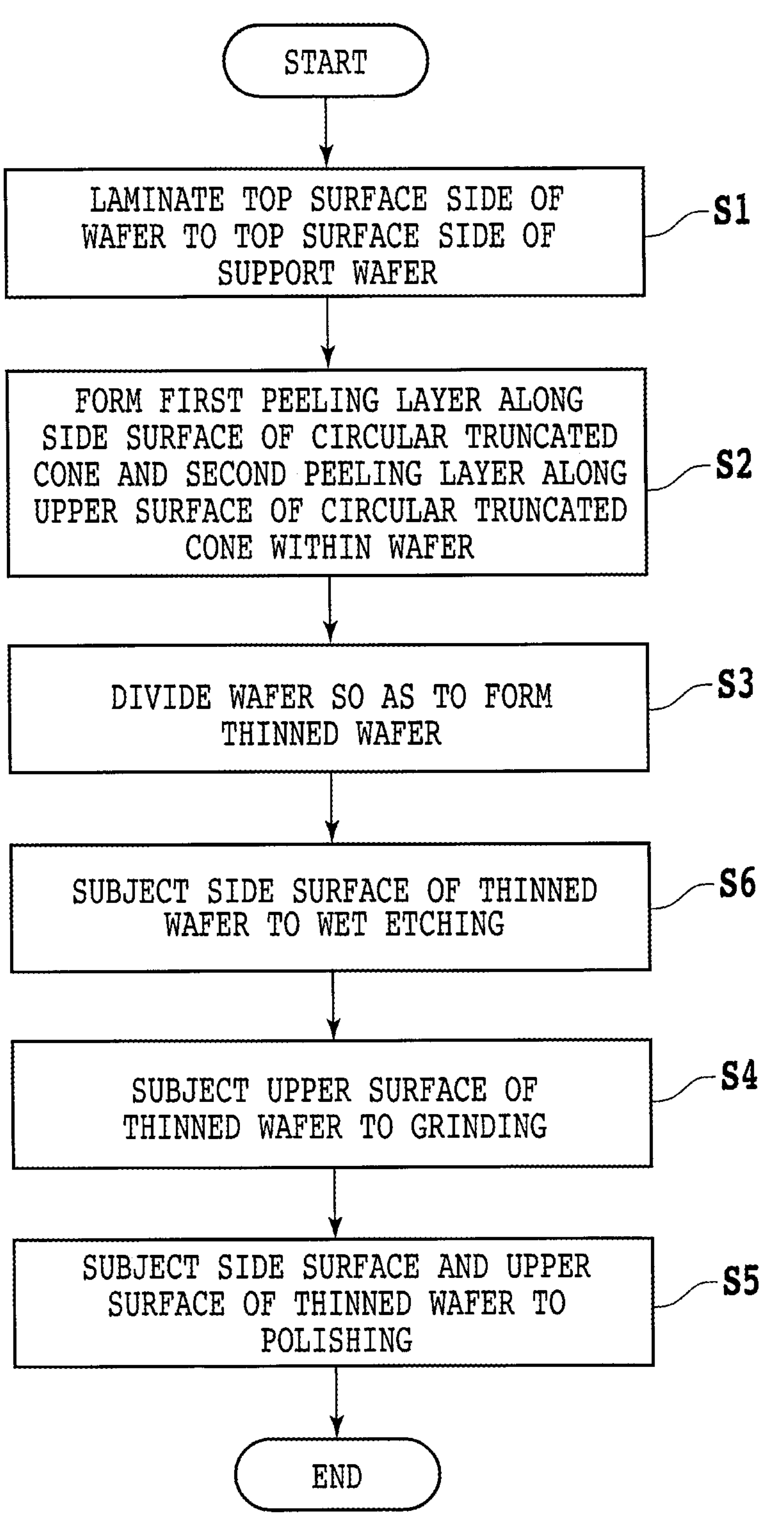
FIG. 12 is a flowchart schematically depicting another example of the wafer processing method.

In addition, the wafer processing method according to the present invention may include a wet etching step that is performed to alleviate the unevenness of the side surface 25*a* of the thinned wafer 25. FIG. 12 is a flowchart schematically depicting an example of the wafer processing method including the wet etching step.

Figure 13:
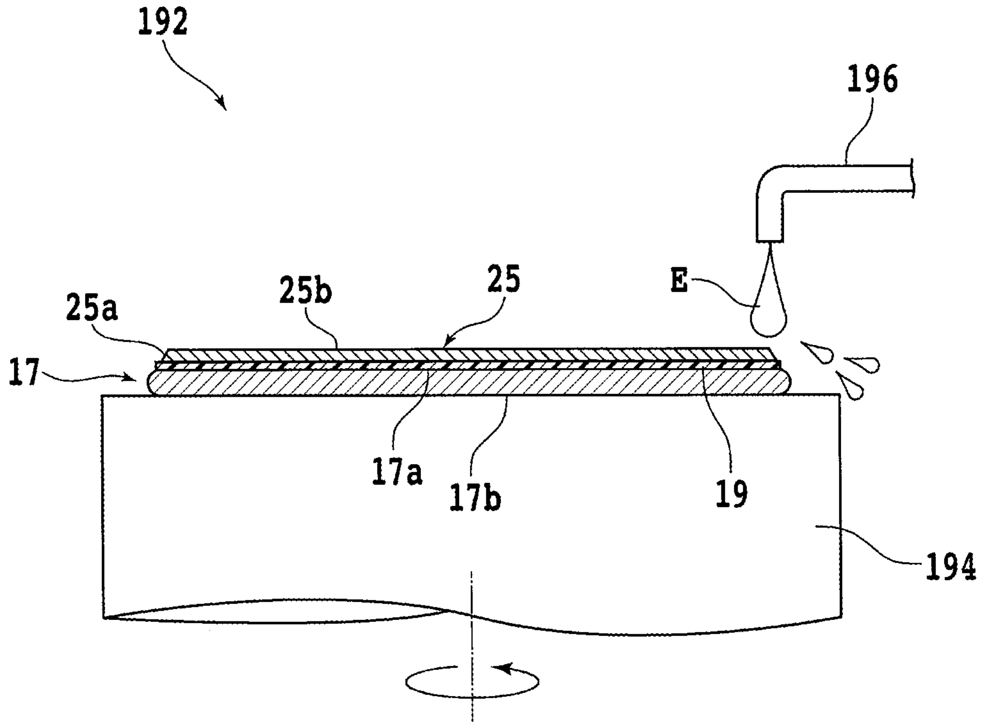
FIG. 13 is a partially sectional side view schematically depicting a manner in which the side surface of the thinned wafer is subjected to wet etching.

In the method depicted in FIG. 12, after the dividing step S3 is performed and before the grinding step S4 is performed, the side surface 25*a* of the thinned wafer 25 is subjected to wet etching (wet etching step S6). FIG. 13 is a partially sectional side view schematically depicting a manner in which the side surface 25*a* of the thinned wafer 25 is subjected to wet etching.

The wet etching step S6 is performed in a wet etching apparatus 192 depicted in FIG. 13, for example. The wet etching apparatus 192 includes a holding table 194 that holds the laminated wafer including the thinned wafer 25.

The holding table 194 has an upper surface (holding surface) in a circular shape. A porous plate (not depicted) is exposed on the holding surface. Further, this porous plate communicates with a suction source (not depicted) such as an ejector via a flow passage provided within the holding table 194 or the like.

Then, when the suction source is operated, a suction force acts on a space in the vicinity of the holding surface of the holding table 194. Therefore, when the suction source is operated in a state in which the laminated wafer described above is placed on the holding table 194, for example, the laminated wafer can be held on the holding table 194.

In addition, the holding table 194 is coupled to a rotational driving source (not depicted) such as a motor. Then, when this rotational driving source is operated, the holding table 194 rotates with a straight line as a rotational axis which straight line passes through the center of the holding surface and is parallel with the vertical direction. Further, the holding table 194 may be coupled to a horizontal moving mechanism (not depicted) for moving the holding table 194 along a horizontal direction.

In addition, an etchant supply nozzle 196 is provided above the holding table 194. The etchant supply nozzle 196 supplies an etching agent E directly downward from a distal end of the etchant supply nozzle 196. Incidentally, the etching agent E includes, for example, a hydrofluoric acid or the like. Further, the etchant supply nozzle 196 can be moved in the horizontal direction. For example, the etchant supply nozzle 196 can be moved so as to swing about a proximal end thereof.

The wet etching apparatus 192 performs the wet etching step S6 in the following order, for example. Specifically, first, the laminated wafer is placed on the holding table 194 such that the center of the undersurface 17*b* of the support wafer 17 in the laminated wafer including the thinned wafer 25 and the center of the holding surface of the holding table 194 are made to coincide with each other.

Next, the suction source communicating with the porous plate exposed on the holding surface is operated such that the laminated wafer is held by the holding table 194. Next, the holding table 194 and the etchant supply nozzle 196 are moved relative to each other such that the side surface 25*a* of the thinned wafer 25 is positioned directly below the distal end of the etchant supply nozzle 196.

Next, while the etching agent E is supplied from the distal end of the etchant supply nozzle 196 to the side surface 25*a* of the thinned wafer 25, the rotational driving source is operated so as to rotate the laminated wafer over a predetermined period. Consequently, the side surface 25*a* of the thinned wafer 25 is etched by the etching agent E, so that the unevenness present on the side surface 25*a* is alleviated. The wet etching step S6 is thereby completed.

Incidentally, a region at an outer circumference and in a vicinity thereof or the like in the upper surface 25*b* of the thinned wafer 25 may be etched by the etching agent E in the wet etching step S6. Similarly, in the wet etching step S6, the side surface of the support wafer 17 may be etched by the etching agent E.

Further, in the wet etching step S6, the entire region of the upper surface 25*b* of the thinned wafer 25 may be etched by the etching agent E. In this case, the unevenness present on the upper surface 25*b* of the thinned wafer 25 is also alleviated in the wet etching step S6. It is therefore possible to reduce a time required for the grinding step S4 described above, and/or suppress wear in the grinding stones used in the grinding step S4.

A wafer grinding method depicted in FIG. 12 performs the polishing step S5 after performing the wet etching step S6 for alleviating the unevenness of the side surface 25*a* of the thinned wafer 25 and the grinding step S4 for alleviating the unevenness of the upper surface 25*b*. This case is preferable in that a burden of the polishing layer of the polishing pad 176 can be reduced as compared with a case where the grinding step S4 and the polishing step S5 are performed without the wet etching step S6 being performed.

Specifically, in the case where the wet etching step S6 is not performed, a part of the polishing layer which part comes into contact with the side surface 25*a* is worn heavily due to the presence of the unevenness of the side surface 25*a* of the thinned wafer 25. On the other hand, in the case where the wet etching step S6 is performed, the unevenness of the side surface 25*a* of the thinned wafer 25 is alleviated, and therefore a local wear in the polishing layer can be prevented.

Figure 14:
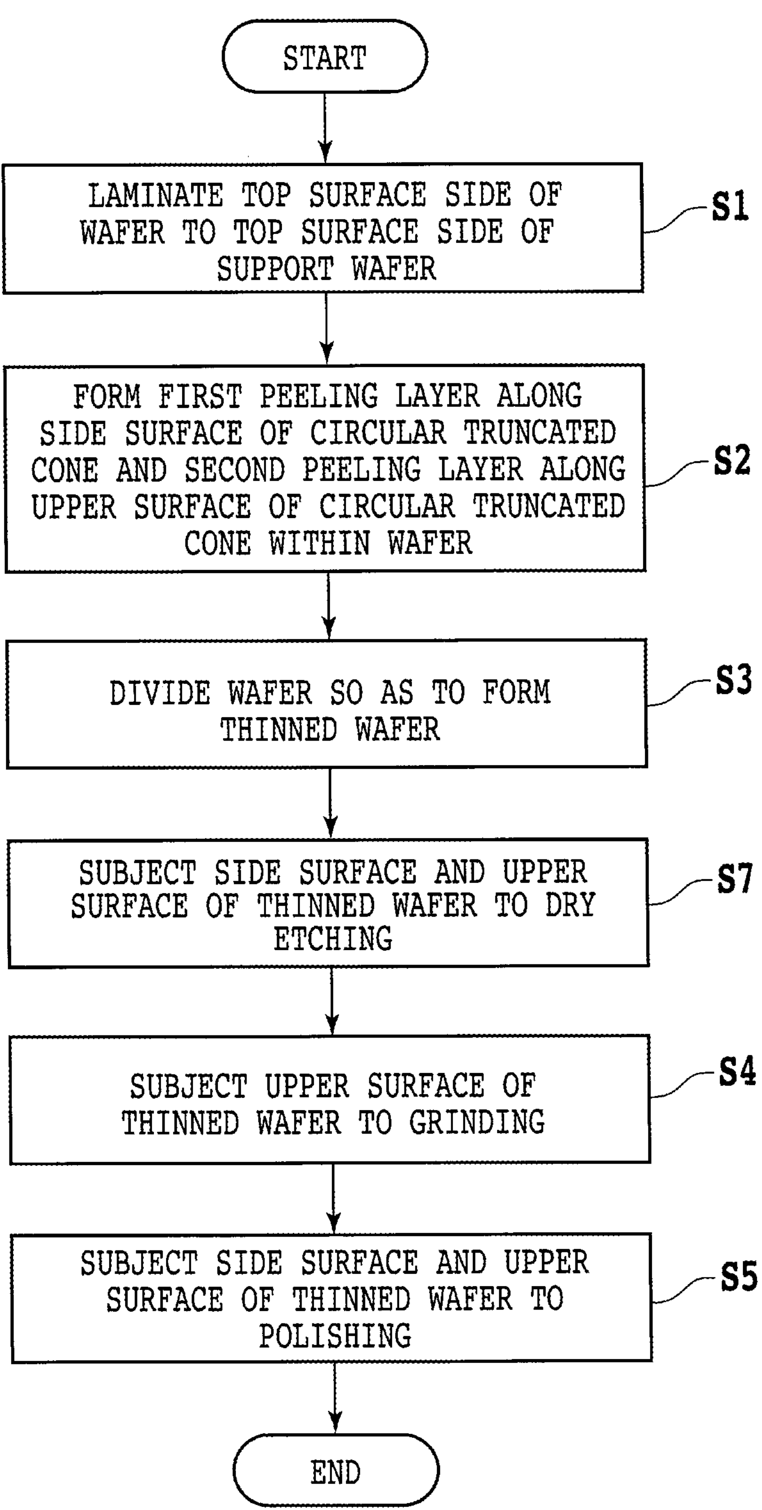
FIG. 14 is a flowchart schematically depicting yet another example of the wafer processing method.

In addition, the wafer processing method according to the present invention may include a dry etching step that is performed to alleviate the unevenness of at least the side surface 25*a* of the thinned wafer 25. FIG. 14 is a flowchart schematically depicting an example of the wafer processing method including the dry etching step.

Figure 15:
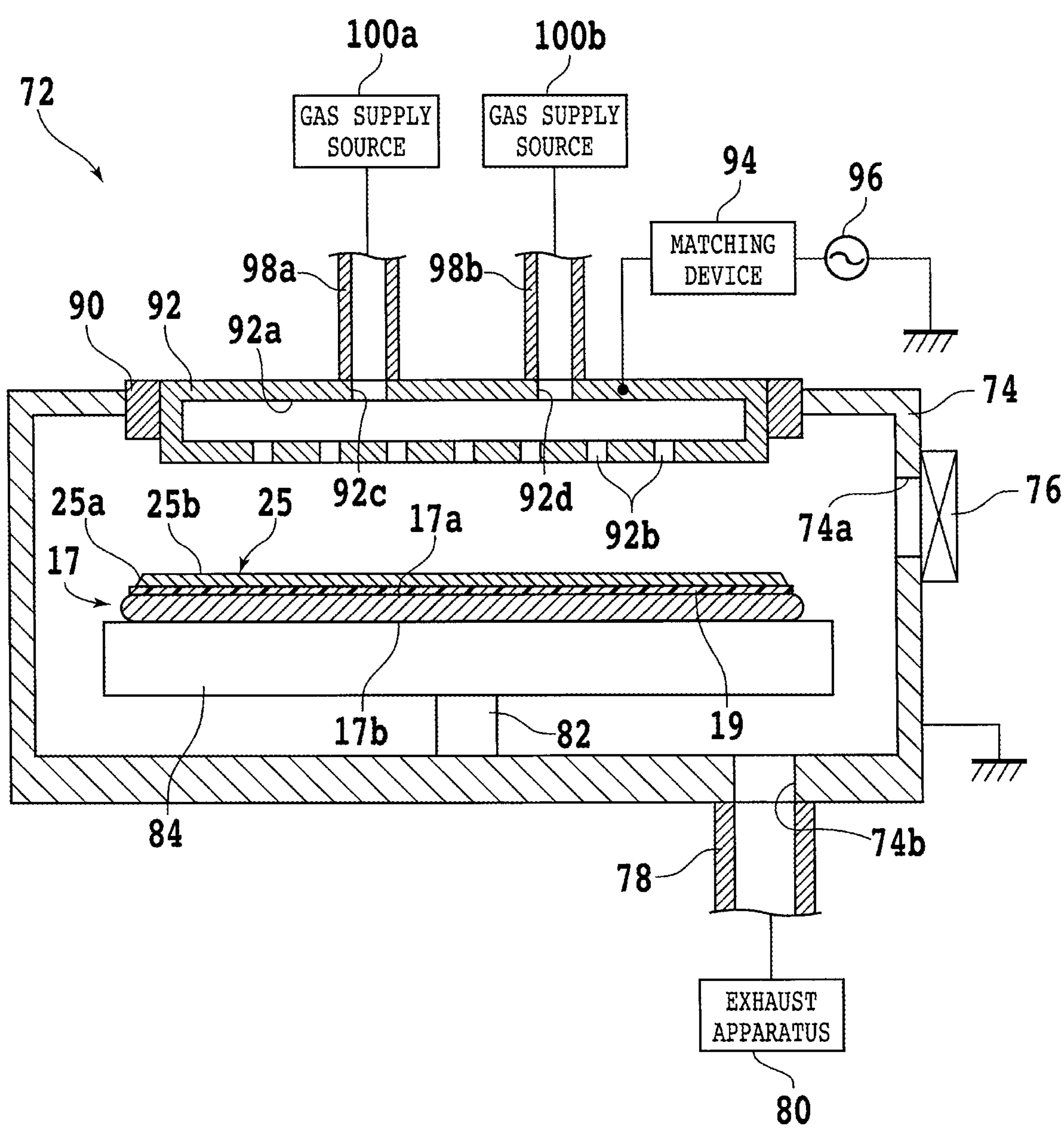
FIG. 15 is a diagram schematically depicting a manner in which the side surface and upper surface of the thinned wafer are subjected to dry etching.

The method depicted in FIG. 14 subjects the side surface 25*a* and the upper surface 25*b* of the thinned wafer 25 to dry etching (dry etching step S7) after performing the dividing step S3 and before performing the grinding step S4. FIG. 15 is a diagram schematically depicting a manner in which the side surface 25*a* and the upper surface 25*b* of the thinned wafer 25 are subjected to dry etching.

The dry etching step S7 is, for example, performed in a dry etching apparatus 72 depicted in FIG. 15. Incidentally, in FIG. 15, a part of constituent elements of the dry etching apparatus 72 are represented by functional blocks. The dry etching apparatus 72 has a chamber 74 formed of a conductive material and grounded.

The chamber 74 has a loading and unloading port 74*a* formed thereon for loading the laminated wafer including the thinned wafer 25 into the inside and unloading the laminated wafer including the thinned wafer 25 from the inside. The loading and unloading port 74*a* is provided with a gate valve 76 that can make an internal space and an external space of the chamber 74 isolated from each other or make the internal space and the external space communicate with each other. In addition, the chamber 74 has an exhaust port 74*b* formed thereon for exhausting the internal space.

The exhaust port 74*b* communicates with an exhaust apparatus 80 such as a vacuum pump via a pipe 78 or the like. In addition, a support member 82 is provided to the inner surface of the chamber 74. The support member 82 supports a table 84. Moreover, an electrostatic chuck (not depicted) is provided to an upper portion of the table 84.

In addition, an opening in a disk shape is formed at a position of the chamber 74 which position faces the upper surface of the table 84. This opening is provided with a gas jetting head 92 that is supported by the chamber 74 via a bearing 90. The gas jetting head 92 is formed of a conductive material. In addition, the gas jetting head 92 is connected to a high-frequency power supply 96 via a matching device 94.

In addition, a cavity (gas diffusion space) 92*a* is formed within the gas jetting head 92. In addition, a plurality of gas discharge ports 92*b* that make the gas diffusion space 92*a* and the internal space of the chamber 74 communicate with each other are formed in an inner part (for example, a lower portion) of the gas jetting head 92. In addition, two gas supply ports 92*c* and 92*d* for supplying predetermined gases to the gas diffusion space 92*a* are formed in an outer part (for example, an upper portion) of the gas jetting head 92.

Further, the gas supply port 92*c* communicates with a gas supply source 100*a* that supplies, for example, a sulfur fluoride-based gas or the like such as $SF_6$ via a pipe 98*a* or the like. In addition, the gas supply port 92*d* communicates with a gas supply source 100*b* that supplies, for example, an inert gas or the like such as Ar via a pipe 98*b* or the like.

The dry etching apparatus 72 performs the dry etching step S7 in the following order, for example. Specifically, first, the laminated wafer is loaded onto the table 84 such that the thinned wafer 25 is on an upper side in a state in which the gate valve 76 makes the internal space and the external space of the chamber 74 communicate with each other.

Next, the electrostatic chuck of the table 84 holds the laminated wafer. Next, the exhaust apparatus 80 exhausts the internal space of the chamber 74 to form a vacuum state. Next, plasma etching (dry etching) of the side surface 25*a* and the upper surface 25*b* of the thinned wafer 25 is performed.

Specifically, this plasma etching is, for example, performed by providing high-frequency power from the high-frequency power supply 96 to the gas jetting head 92 in a state in which the internal space of the chamber 74 is supplied with a gas including $SF_6$ from the gas supply source 100*a* and is supplied with an Ar gas from the gas supply source 100*b*.

Consequently, the side surface 25*a* and the upper surface 25*b* of the thinned wafer 25 are etched by an F-based radical or the like generated in the internal space of the chamber 74, so that the unevenness present on the side surface 25*a* and the upper surface 25*b* is alleviated. The dry etching step S7 is thereby completed.

Incidentally, in the dry etching step S7, the upper surface 25*b* of the thinned wafer 25 may be subjected to dry etching in a state in which a mask is provided to the upper surface 25*b*. That is, in the dry etching step S7, it suffices to subject at least the side surface 25*a* of the thinned wafer 25 to dry etching.

A wafer grinding method depicted in FIG. 14 performs the polishing step S5 after performing the dry etching step S7 for alleviating the unevenness of at least the side surface 25*a* of the thinned wafer 25 and the grinding step S4 for alleviating the unevenness of the upper surface 25*b* of the thinned wafer 25. This case is preferable in that a burden of the polishing layer of the polishing pad 176 can be reduced as compared with a case where the grinding step S4 and the polishing step S5 are performed without the dry etching step S7 being performed.

Specifically, in the case where the dry etching step S7 is not performed, a part of the polishing layer which part comes into contact with the side surface 25*a* is worn heavily due to the presence of the unevenness of the side surface 25*a* of the thinned wafer 25. On the other hand, in the case where the dry etching step S7 is performed, the unevenness of the side surface 25*a* of the thinned wafer 25 is alleviated, and therefore a local wear in the polishing layer can be prevented.

Besides, structures, methods, and the like according to the foregoing embodiment can be modified and implemented as appropriate without departing from the objective scope of the present invention.

The present invention is not limited to the details of the above described preferred embodiment. The scope of the invention is defined by the appended claims and all changes and modifications as fall within the equivalence of the scope of the claims are therefore to be embraced by the invention.

What is claimed is:

1. A wafer processing method for dividing a wafer at a peeling layer, the wafer having a plurality of devices formed on a top surface side of the wafer and including a chamfered outer circumferential region, by applying an external force to the wafer along a thickness direction of the wafer after forming the peeling layer within the wafer by irradiating the wafer with a laser beam having a wavelength that passes through the wafer, the wafer processing method comprising:

a peeling layer forming step of forming a first peeling layer along a side surface of a circular truncated cone and a second peeling layer along a second base of the circular truncated cone, the circular truncated cone being defined by a first base located on the top surface side of the wafer, the side surface that has one end coinciding with an outer circumference of the first base and is inclined so as to become more distant from the outer circumferential region with increasing distance from the top surface side of the wafer, and the second base that has an outer circumference coinciding with another end of the side surface and is parallel with the first base;

a dividing step of dividing the wafer so as to form a thinned wafer that has a first peeling surface exposed by being divided at the first peeling layer and has a second peeling surface exposed by being divided at the second peeling layer after performing the peeling layer forming step;

a grinding step of subjecting the second peeling surface to grinding after performing the dividing step; and a polishing step of subjecting the first peeling surface and the second peeling surface to polishing after performing the grinding step.

2. The wafer processing method according to claim 1, further comprising:

a laminating step of laminating the top surface side of the wafer to a top surface side of a second wafer different from the wafer before performing the dividing step.

3. The wafer processing method according to claim 1, wherein in the peeling layer forming step, one of the first peeling layer and the second peeling layer is formed, and then the other is formed.

4. The wafer processing method according to claim 1, wherein the wafer includes a first region and a second region each extending along a predetermined direction, the first peeling layer includes a pair of first inclined portions formed in the first region and a pair of second inclined portions formed in the second region, the second peeling layer includes a first linear portion formed in the first region and located between the pair of first inclined portions in the predetermined direction and a second linear portion formed in the second region and located between the pair of second inclined portions in the predetermined direction, and in the peeling layer forming step, the pair of first inclined portions and the first linear portion are formed, and then the pair of second inclined portions and the second linear portion are formed.

5. The wafer processing method according to claim 1, wherein an angle formed between the first base and the side surface of the circular truncated cone is equal to or more than 1° and equal to or less than 80°.

6. A wafer processing method for dividing a wafer at a peeling layer, the wafer having a plurality of devices formed on a top surface side of the wafer and including a chamfered outer circumferential region, by applying an external force to the wafer along a thickness direction of the wafer after forming the peeling layer within the wafer by irradiating the wafer with a laser beam having a wavelength that passes through the wafer, the wafer processing method comprising:

a peeling layer forming step of forming a first peeling layer along a side surface of a circular truncated cone and a second peeling layer along a second base of the circular truncated cone, the circular truncated cone being defined by a first base located on the top surface side of the wafer, the side surface that has one end coinciding with an outer circumference of the first base and is inclined so as to become more distant from the outer circumferential region with increasing distance from the top surface side of the wafer, and the second base that has an outer circumference coinciding with another end of the side surface and is parallel with the first base;

a dividing step of dividing the wafer so as to form a thinned wafer that has a first peeling surface exposed by being divided at the first peeling layer and has a second peeling surface exposed by being divided at the second peeling layer after performing the peeling layer forming step;

a wet etching step of subjecting at least the first peeling surface to wet etching after performing the dividing step;

a grinding step of subjecting the second peeling surface to grinding after performing the wet etching step; and a polishing step of subjecting the first peeling surface and the second peeling surface to polishing after performing the grinding step.

7. The wafer processing method according to claim 6, further comprising:

a laminating step of laminating the top surface side of the wafer to a top surface side of a second wafer different from the wafer before performing the dividing step.

8. The wafer processing method according to claim 6, wherein in the peeling layer forming step, one of the first peeling layer and the second peeling layer is formed, and then the other is formed.

9. The wafer processing method according to claim 6, wherein the wafer includes a first region and a second region each extending along a predetermined direction, the first peeling layer includes a pair of first inclined portions formed in the first region and a pair of second inclined portions formed in the second region, the second peeling layer includes a first linear portion formed in the first region and located between the pair of first inclined portions in the predetermined direction and a second linear portion formed in the second region and located between the pair of second inclined portions in the predetermined direction, and in the peeling layer forming step, the pair of first inclined portions and the first linear portion are formed, and then the pair of second inclined portions and the second linear portion are formed.

10. The wafer processing method according to claim 6, wherein an angle formed between the first base and the side surface of the circular truncated cone is equal to or more than 1° and equal to or less than 80°.

11. A wafer processing method for dividing a wafer at a peeling layer, the wafer having a plurality of devices formed on a top surface side of the wafer and including a chamfered outer circumferential region, by applying an external force to the wafer along a thickness direction of the wafer after forming the peeling layer within the wafer by irradiating the wafer with a laser beam having a wavelength that passes through the wafer, the wafer processing method comprising:

a peeling layer forming step of forming a first peeling layer along a side surface of a circular truncated cone and a second peeling layer along a second base of the circular truncated cone, the circular truncated cone being defined by a first base located on the top surface side of the wafer, the side surface that has one end coinciding with an outer circumference of the first base and is inclined so as to become more distant from the outer circumferential region with increasing distance from the top surface side of the wafer, and the second base that has an outer circumference coinciding with another end of the side surface and is parallel with the first base;

a dividing step of dividing the wafer so as to form a thinned wafer that has a first peeling surface exposed by being divided at the first peeling layer and has a second peeling surface exposed by being divided at the second peeling layer after performing the peeling layer forming step;

a dry etching step of subjecting at least the first peeling surface to dry etching after performing the dividing step;

a grinding step of subjecting the second peeling surface to grinding after performing the dry etching step; and a polishing step of subjecting the first peeling surface and the second peeling surface to polishing after performing the grinding step.

12. The wafer processing method according to claim 11, further comprising:

a laminating step of laminating the top surface side of the wafer to a top surface side of a second wafer different from the wafer before performing the dividing step.

13. The wafer processing method according to claim 11, wherein in the peeling layer forming step, one of the first peeling layer and the second peeling layer is formed, and then the other is formed.

14. The wafer processing method according to claim 11, wherein the wafer includes a first region and a second region each extending along a predetermined direction, the first peeling layer includes a pair of first inclined portions formed in the first region and a pair of second inclined portions formed in the second region, the second peeling layer includes a first linear portion formed in the first region and located between the pair of first inclined portions in the predetermined direction and a second linear portion formed in the second region and located between the pair of second inclined portions in the predetermined direction, and in the peeling layer forming step, the pair of first inclined portions and the first linear portion are formed, and then the pair of second inclined portions and the second linear portion are formed.

15. The wafer processing method according to claim 11, wherein an angle formed between the first base and the side surface of the circular truncated cone is equal to or more than 1° and equal to or less than 80°.

16. The wafer processing method according to claim 11, wherein in the dry etching step, the second peeling surface is subjected to the dry etching together with the first peeling surface.

17. The wafer processing method according to claim 11, wherein in the dry etching step, the first peeling surface is subjected to the dry etching in a state in which the second peeling surface is provided with a mask.

* * * * *